(12) United States Patent
Mukherjee et al.

(10) Patent No.: US 9,711,591 B2
(45) Date of Patent: Jul. 18, 2017

(54) METHODS OF FORMING HETERO-LAYERS WITH REDUCED SURFACE ROUGHNESS AND BULK DEFECT DENSITY OF NON-NATIVE SURFACES AND THE STRUCTURES FORMED THEREBY

(75) Inventors: Niloy Mukherjee, Beaverton, OR (US); Matthew V. Metz, Portland, OR (US); James M. Powers, Beaverton, OR (US); Van H. Le, Portland, OR (US); Benjamin Chu-Kung, Hillsboro, OR (US); Mark R. Lemay, Vernonia, OR (US); Marko Radosavljevic, Beaverton, OR (US); Niti Goel, Hillsboro, OR (US); Loren Chow, Los Altos, CA (US); Peter G. Tolchinsky, Beaverton, OR (US); Jack T. Kavalieros, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,607

(22) PCT Filed: Dec. 28, 2011

(86) PCT No.: PCT/US2011/067661
§ 371 (c)(1),
(2), (4) Date: Jun. 24, 2013

(87) PCT Pub. No.: WO2013/101001
PCT Pub. Date: Jul. 4, 2013

(65) Prior Publication Data
US 2014/0203326 A1    Jul. 24, 2014

(51) Int. Cl.
*H01L 21/02* (2006.01)
*H01L 29/06* (2006.01)

(52) U.S. Cl.
CPC .......... *H01L 29/06* (2013.01); *H01L 21/0237* (2013.01); *H01L 21/0245* (2013.01);
(Continued)

(58) Field of Classification Search
CPC ......... H01L 21/02505; H01L 21/02664; H01L 21/324; H01L 26/06; H01L 21/0237
(Continued)

(56) References Cited

U.S. PATENT DOCUMENTS

| 5,659,188 A | * | 8/1997 | Kao et al. ................ 257/190 |
| 6,165,894 A |   | 12/2000 | Pramanick et al. |

(Continued)

FOREIGN PATENT DOCUMENTS

| CN | 1816910 A | 8/2006 |
| TW | 200401340 A | 1/2004 |

OTHER PUBLICATIONS

International Search Report mailed Sep. 26, 2012 for PCT/US2011/067661, filed Dec. 28, 2011, 3 pages.
(Continued)

*Primary Examiner* — Marc Armand
*Assistant Examiner* — Sarah Salerno
(74) *Attorney, Agent, or Firm* — Blakely, Sokoloff, Taylor & Zafman LLP

(57) ABSTRACT

Methods of forming hetero-layers with reduced surface roughness and bulk defect density on non-native surfaces and the devices formed thereby are described. In one embodiment, the method includes providing a substrate having a top surface with a lattice constant and depositing a first layer on the top surface of the substrate. The first layer has a top surface with a lattice constant that is different from the first lattice constant of the top surface of the substrate. The first layer is annealed and polished to form a polished surface. A second layer is then deposited above the polished surface.

10 Claims, 17 Drawing Sheets

(52) U.S. Cl.
CPC ...... *H01L 21/0251* (2013.01); *H01L 21/0259* (2013.01); *H01L 21/02455* (2013.01); *H01L 21/02494* (2013.01); *H01L 21/02502* (2013.01); *H01L 21/02505* (2013.01); *H01L 21/02513* (2013.01); *H01L 21/02532* (2013.01); *H01L 21/02538* (2013.01); *H01L 21/02587* (2013.01); *H01L 21/02617* (2013.01); *H01L 21/02636* (2013.01); *H01L 21/02658* (2013.01); *H01L 21/02664* (2013.01)

(58) Field of Classification Search
USPC ............ 438/478; 257/190, E21.12, E21.324, 257/E21.576
See application file for complete search history.

(56) References Cited

U.S. PATENT DOCUMENTS

| | | | |
|---|---|---|---|
| 6,878,610 B1* | 4/2005 | Lin et al. | 438/478 |
| 7,147,709 B1* | 12/2006 | Ong | C30B 33/00 117/2 |
| 8,274,097 B2* | 9/2012 | Cheng | 257/190 |
| 2004/0021407 A1 | 2/2004 | Baillie et al. | |
| 2004/0214407 A1 | 10/2004 | Westhoff et al. | |
| 2005/0196925 A1 | 9/2005 | Kim et al. | |
| 2010/0025683 A1 | 2/2010 | Cheng | |

OTHER PUBLICATIONS

International Preliminary Report on Patentability and Written Opinion for PCT/US2011/067661, filed Dec. 28, 2011; mailed Jul. 1, 2014; 7pgs.

Office Action for Taiwan Application No. 101147483, mailed Apr. 13, 2015; 29pgs, and English translation thereof.

Office Action for Taiwan Application No. 104128113 and Taiwan IPO Search Report, dated Mar. 14, 2016, mailed Mar. 30, 2016, (16 pages).

Office Action for German Application No. 112011106054.8 dated May 6, 2016, mailed May 18, 2016, (10 pages).

Second Office Action—Chinese Patent Application No. 201180076458.X; dated Aug. 2, 2016, 3 pages.

Notice of Allowance—Chinese Patent Application No. 201180076458.X; dated Sep. 29, 2016, 4 pages.

Notice of Allowance—Taiwan Patent Application No. 104128113; dated Jul. 20, 2016, 2 pages.

* cited by examiner

METHODS OF FORMING HETERO-LAYERS WITH REDUCED SURFACE ROUGHNESS AND BULK DEFECT DENSITY OF NON-NATIVE SURFACES AND THE STRUCTURES FORMED THEREBY

CROSS-REFERENCE TO RELATED APPLICATION

This patent application is a U.S. National Phase Application under 35 U.S.C. §371 of International Application No. PCT/US2011/067661, filed Dec. 28, 2011, entitled METHODS OF FORMING HETERO-LAYERS WITH REDUCED SURFACE ROUGHNESS AND BULK DEFECT DENSITY ON NON-NATIVE SURFACES AND THE STRUCTURES FORMED THEREBY.

BACKGROUND

1) Field

Embodiments of the present invention relate to methods of forming hetero-layers with reduced surface roughness and bulk defect density on non-native surfaces and the structures formed thereby.

2) Description of Related Art

The fabrication of next-generation semiconductor devices involves forming transistor devices over heterogeneous semiconductor layers on non-native substrates having a different lattice constant. The integration of such heterogeneous semiconductors layers on non-native substrates is typically achieved by using buffers layers to provide a means of gradually changing the lattice constant from that of the substrate to that of the active device layer. Defects are generated during the formation of buffer layers and result in high bulk defect densities as well as rough surfaces/interfaces. Annealing the buffer layers may reduce bulk defect densities, however, it also typically increases the surface roughness. For subsequent successful device integration and performance, it is necessary to reduce both bulk defect density and surface roughness. The conventional "growth-anneal-growth anneal" approach that alternates between growing and annealing buffer layers does not provide a means to form buffer layers having bulk defect densities and surface roughness that are sufficiently low to successfully manufacture next-generation high-k metal gate transistor devices.

BRIEF DESCRIPTION OF THE DRAWINGS

Embodiments of the present disclosure are illustrated by way of example, and not by way of limitation, in the figures of the accompanying drawings, in which.

DETAILED DESCRIPTION

Figure 1:
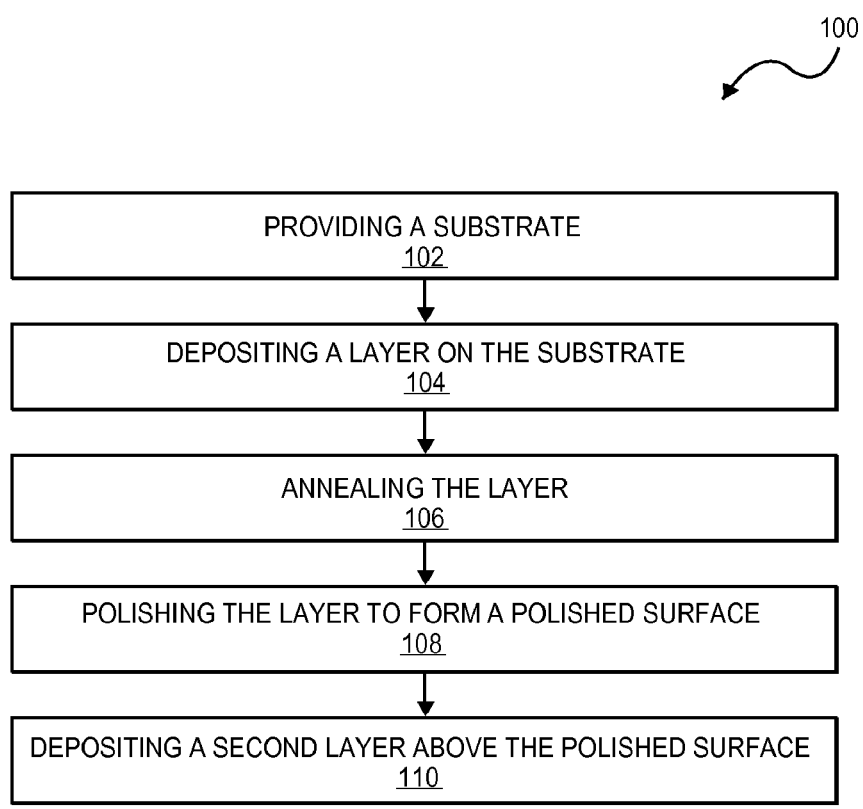
FIG. 1 is a flow chart representing a method of forming hetero-layers with reduced surface roughness and bulk defect density on non-native surfaces, in accordance with an embodiment of the present invention.

Methods of forming hetero-layers with reduced surface roughness and bulk defect density on non-native surfaces and the structures formed thereby are described. In the following description, numerous details are set forth. It will be apparent, however, to one skilled in the art, that embodiments of the present invention may be practiced without these specific details. In other instances, well-known aspects, such as epitaxial deposition and chemical mechanical polishing techniques, are not described in detail to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The production of next generation semiconductor devices requires integrating hetero-layers onto non-native substrates having different lattice constants. For successful device integration and performance, it is necessary that the hetero-layers have both a low bulk defect density and minimal surface roughness. In accordance with one or more embodiments of the present invention, methods of forming hetero-layers with reduced surface roughness and bulk defect density on non-native surfaces and the structures formed thereby are described. The method comprises providing a substrate having a top surface with a lattice constant and depositing a layer on the top surface of the substrate. The layer may be part of a buffer layer that grades the lattice constant from the substrate to a subsequently formed device layer. The layer has a top surface with a lattice constant that is different from the lattice constant of the top surface of the substrate. The layer is annealed and polished to form a polished surface. Annealing reduces the bulk defect density of the layer while the polishing process reduces surface roughness that accumulates during anneal. In one embodiment, the layer is annealed at a sufficiently high temperature and for a sufficiently long time to achieve a bulk defect density that is less than 1E7 defects/cm2 and a root-mean-square surface roughness greater than 20 nm. The polished surface may have a root-mean-square surface roughness of less than 1 nm and a peak-to-valley surface roughness range of less than 10 nm. A second layer is then deposited above the polished surface. The second layer may be a device layer on which transistor devices are subsequently formed. Alternatively, the second layer may be part of the buffer layer that helps to grade the lattice constant from the substrate to a subsequently formed device layer.

Embodiments of the present invention may further include forming aspect ratio trapping (ART) features. ART features improve device performance and integration by reducing threading dislocation defects on the subsequently formed device layer. ART features provide non-crystalline sidewalls at which bulk defects terminate. Terminating the bulk defects in the ART features thus significantly reduces the number of defects that migrate to the surface during annealing. In one such embodiment, ART features are formed on the top surface of the substrate. The ART features are spaced apart to form ART trenches and the layer is deposited in the ART trenches. In an embodiment, the ART trenches have an aspect ratio greater than 1. The ART features have a top surface that is approximately planar with the polished surface of the layer.

Embodiments of the present invention may also include depositing a capping layer on the layer after annealing but prior to polishing. The capping layer serves as a barrier to protect the layer from oxidizing during polishing. The capping layer may be necessary when the layer comprises a material that forms an oxide that cannot be removed using cost-effective and manufacturable methods (e.g., aluminum containing single crystalline semiconductor compounds). The capping layer itself comprises of a material that, when oxidized, forms an oxide that can be removed using cost-effective and manufacturable methods. In one such embodiment, a capping layer is deposited on the layer after annealing but prior to polishing. The capping layer has approximately the same lattice constant as the top surface of the layer. The capping layer is then polished to form a polished capping surface. The polished capping surface may have a root-mean-square surface roughness of less than 1 nm and a peak-to-valley surface roughness range of less than 10 nm. A second layer is then deposited above the polished capping surface. As previously mentioned, the second layer may be a device layer on which transistor devices are subsequently formed. Alternatively, the second layer may be part of the buffer layer that helps to grade the lattice constant from the substrate to a subsequently formed device layer.

Figure 2A:
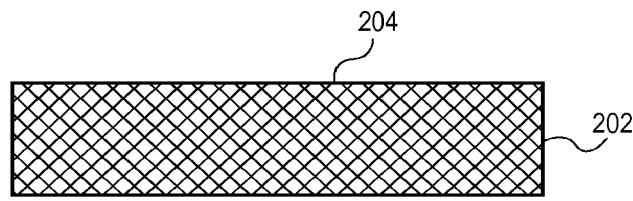
FIG. 2A to 2E illustrate the cross-sectional views representing steps in a method of forming hetero-layers with reduced surface roughness and bulk defect density on non-native surfaces, in accordance with an embodiment of the present invention.

FIG. 1 is a flow chart 100 representing a method of forming hetero-layers with reduced surface roughness and bulk defect density on non-native surfaces, in accordance with an embodiment of the present invention. FIGS. 2A to 2E illustrate cross-sectional views representing a method of forming hetero-layers with reduced surface roughness and bulk defect density on non-native surfaces, in accordance with an embodiment of the present invention. The method begins at step 102 in flow chart 100 by providing a substrate 202 as shown in FIG. 2A. Substrate 202 is the material on which hetero-layers with reduced surface roughness and bulk defect density are formed. Substrate 202 has a top surface 204 with a lattice constant. In an embodiment, substrate 202 comprises a material having a lattice constant, such as a single crystalline semiconductor material (e.g., silicon, germanium, silicon germanium, and sapphire). In an embodiment, substrate 202 may comprise of a group III-V single crystalline semiconductor compound such as, but not limited to, gallium nitride, gallium phosphide, gallium arsenide, indium phosphide, indium antimonide, indium gallium arsenide, aluminum gallium arsenide, indium gallium phosphide or a combination thereof. In another embodiment, substrate 202 includes a top single crystalline layer having a lattice constant. For example, substrate 202 may comprise one or more semiconductor layers epitaxially grown atop a distinct crystalline substrate such as an epitaxial silicon germanium layer on a single crystalline silicon substrate. The epitaxially grown semiconductor layer may have a uniform lattice constant or a lattice constant that changes gradually or discretely with thickness. In a specific embodiment, the substrate 202 is a single crystalline silicon substrate with or without a single crystalline epitaxial silicon layer formed thereon. In a further embodiment, substrate 202 may comprise an insulating layer (e.g., silicon dioxide, silicon nitride, silicon oxynitride and a high-k dielectric layer) in between a crystal substrate and an epitaxial layer to form, for example, a silicon-on-insulator substrate.

Figure 2B:
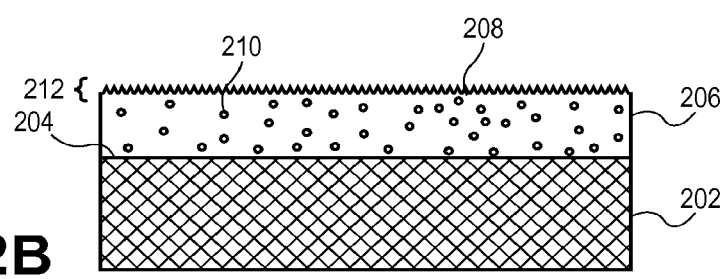

Referring to step 104 in flow chart 100 and the corresponding FIG. 2B, a layer 206 is deposited on the top surface 204 of substrate 202. Layer 206 may be part of a buffer layer formed between the substrate and a subsequently formed device layer. In an embodiment, layer 206 is an epitaxially grown semiconductor crystalline film such as, but not limited to, GaAs, SiGe, GaAsSb, AlAsSb, AlGaSb, GaSbP, InAlAs, InGaAs, and InP. In such an embodiment, the semiconductor film may be deposited in a conventional molecular beam epitaxy or an epitaxial chemical vapor deposition chamber using conventional methods. In an embodiment, the top surface 208 of layer 206 has a lattice constant mismatch with the top surface 204 of substrate 202. In other words, the lattice constant of top surface 208 of layer 206 is different from the lattice constant of top surface 204 of substrate 202. In one such embodiment, the lattice constant of top surface 208 of layer 206 is larger than the lattice constant of top surface 204 of substrate 202. For example, a silicon germanium layer 206 may be epitaxially grown on a single crystalline silicon substrate 202. In another such embodiment, the lattice constant of top surface 208 of layer 206 is smaller than the lattice constant of top surface 204 of substrate 202. In an embodiment, the lattice constant mismatch between the top surface 204 of substrate 202 and the top surface 208 of layer 206 is at least about 1% and in a specific embodiment is between about 2% and 4%.

In an embodiment, layer 206 may have a uniform lattice constant that is equal to the lattice constant of the top surface 208. A uniform lattice constant is advantageous because it eliminates uncertainty in the lattice constant of polished surface 216 formed after the subsequent polishing of layer 206 in step 108. In another embodiment, layer 206 may have a graded lattice constant that changes with the thickness of layer 206. The graded lattice constant may change gradually or in a discrete step-wise fashion. The graded lattice constant may either increase or decrease with thickness of layer 206. In an embodiment, layer 206 is deposited to a thickness that achieves a lattice constant mismatch between the top surface 204 of substrate 202 and the top surface 208 of layer 206 of at least about 1% and in a specific embodiment, between about 2% and 4%. The deposited layer 206 has an initial bulk defect density 210 and the top surface 208 of layer 206 has an initial root-mean-square (RMS) surface roughness 212. The initial bulk defect density 210 may be too high for successful device integration and performance.

Figure 2C:
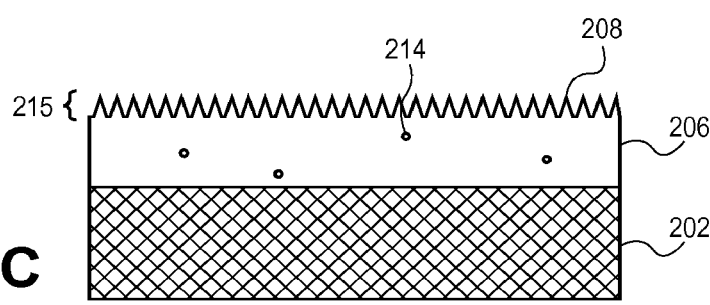

Referring to step 106 in flow chart 100 and corresponding FIG. 2C, layer 206 is annealed. The purpose of annealing is to reduce the bulk defect density of layer 206 to a level sufficient for successful device integration and performance. During annealing, layer 206 may be subjected to a thermal treatment at an elevated temperature for a length of time. In an embodiment, the elevated temperature is greater than the temperature at which layer 206 was deposited, but lower than the temperature at which the stoichiometry of layer 206 begins to degrade and at which layer 206 begins to melt. Layer 206 may be annealed in an atmosphere rich in Group-V vapor (e.g., arsenic and phosphorus) to promote material stability and maintain stoichiometric ratios. During annealing, the bulk defect density 214 of layer 206 decreases while the surface roughness 215 of the top surface 208 of the layer 206 increases. Subsequent polishing of layer 206 in step 108 allows for a more aggressive anneal process where layer 206 may be subjected to higher anneal temperatures and for longer anneal times to achieve lower bulk defect densities and greater RMS surface roughness compared to conventional methods. The increased root-mean-square (RMS) surface roughness 215 will not negatively impact the integration or performance of devices subsequently formed above layer 206 because the subsequent polishing step significantly reduces the surface roughness 215 of the layer 206. In one embodiment, layer 206 is annealed at a sufficiently high temperature and for a sufficiently long time to achieve a bulk defect densities 214 that is at least 10 times lower than the initial bulk defect density 210 and/or a RMS surface roughness 215 that is at least 5 times greater than the initial surface roughness 212. In another embodiment, layer 206 is annealed at a sufficiently high temperature and for a sufficiently long time to achieve a bulk defect density 214 of less than 1E7 defects/cm2 in the layer 206 and/or a RMS surface roughness 215 on the top surface 208 of layer 206 that is greater than 20 nm. In an embodiment, layer 206 is annealed at a temperature between about 600° C. and 800° C. and for a length of time of about 1 hour to 2 hours. For example, a GaAs layer 206 may be annealed at approximately 700° C. for about 1 hour, an InAlAs layer 206 may be annealed at approximately 600° C. for about 1 hours, and a SiGe layer 206 may be annealed between about 600-800° C. for between about 1-2 hours depending on the Ge content. Layer 206 may be annealed in the same chamber (in-situ) in which the layer 206 was deposited. In one embodiment, layer 206 is not exposed to oxygen or water vapor in the atmosphere after layer 206 is deposited and prior to annealing.

Figure 2D:
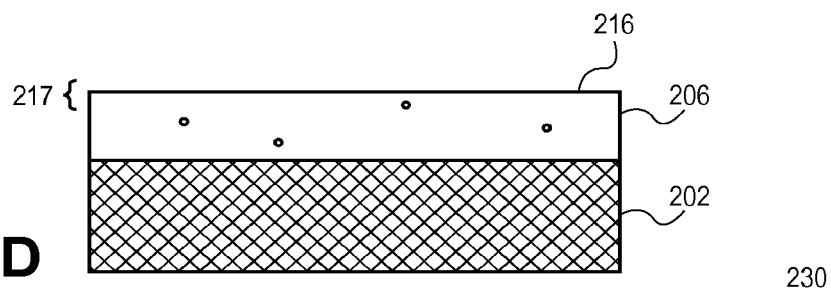

Referring to step 108 in flow chart 100 and corresponding FIG. 2D, layer 206 is polished to form a polished surface 216 having a lattice constant. Layer 206 may be polished in a conventional chemical mechanical polishing (CMP) apparatus using conventional methods. During polishing, the top surface 208 of layer 206 is polished away and the thickness of layer 206 is slightly reduced. The lattice constant of polished surface 216 is easily ascertainable for embodiments where layer 206 has a uniform lattice constant (i.e., where the lattice constant is uniform across layer 206). For such embodiments, the lattice constant of polished surface 216 is approximately equal to the lattice constant of the top surface 208 of layer 206. In one such embodiment, the lattice constants of polished surface 216 and top surface 208 is larger than the lattice constant of top surface 204 of substrate 202. Such certainty in the lattice constant of polished surface 216 provides manufacturability advantages where the lattice constant of a subsequently deposited layer may be accurately controlled to be compatible to the lattice constant of polished surface 216. Polished surface 216 has a RMS surface roughness 217 that is significantly lower than the RMS surface roughness 215 after annealing. In one embodiment, polished surface 216 has a RMS surface roughness of less than 1 nm Ideally, polished surface 216 has a RMS surface roughness 217 of less than 0.5 nm. In a specific embodiment, polished surface 216 has a RMS surface roughness 217 of less than 1 nm and a peak-to-valley surface roughness range of less than 10 nm. The peak-to valley surface roughness range is the distance between the highest and lowest topographic points on polished surface 216.

While not shown in FIG. 2D, an oxide layer may form on the polished surface 216 of layer 206 as a result of exposing layer 206 to water and air during the polishing process in step 108. For successful subsequent device integration and performance, the oxide layer may need to be removed from the polished surface 216 prior to subsequent processing steps. In one embodiment, an oxide layer is removed from the polished surface 216 prior to the subsequent step 110 of depositing the second layer 218. The oxide layer may be removed using conventional wet or dry etching methods and/or by thermal desorption. Ideally, the oxide layer is removed immediately prior to depositing second layer 218 and in the same chamber in which second layer 218 is deposited.

Figure 2E:
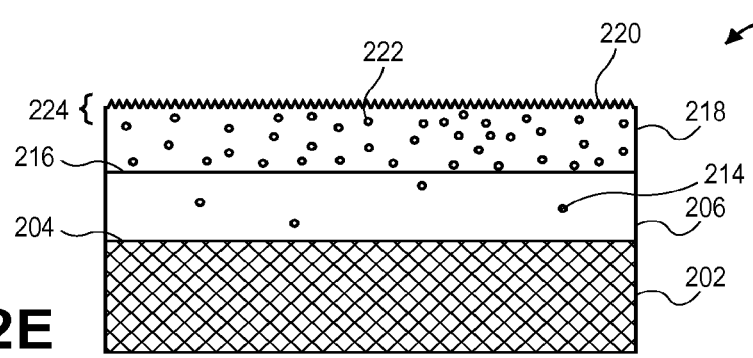

Referring to step 110 in flow chart 100 and corresponding FIG. 2E, a second layer 218 is deposited above polished surface 216. Second layer 218 has a top surface 220 with a lattice constant. In one embodiment, layer 218 is an epitaxially grown single crystalline semiconductor film such as, GaAs, SiGe, GaAsSb, AlAsSb, AlGaSb, GaSbP, InAlAs, InGaAs, and InP. Second layer 218 may be deposited in a conventional epitaxial chemical vapor deposition chamber using conventional methods. Second layer 218 has an initial bulk defect density 222 and an initial surface roughness 224.

Second layer 218 may be deposited directly on polished surface 216. Alternatively, one or more other layers may be deposited between polished surface 216 and second layer 218. For example, an initial layer (not shown) may be deposited on polished surface 216 prior to depositing second layer 218. In an embodiment, the initial layer may serve as a transition between the layer 206 and second layer 218 where the initial layer has a lattice constant approximately equal to the lattice constant of polished surface 216. The initial layer may be deposited immediately prior to second layer 218, in the same chamber as second layer 218 (i.e., in-situ with second layer 218), and in consecutive processing steps.

The method described in flow chart 100 forms the structure 230 shown in FIG. 2E, according to an embodiment. Structure 230 may be a semiconductor structure on which semiconductor devices such as transistors or light emitting diodes (LEDs) are formed. Structure 230 includes a substrate 202 having a top surface 204 with a lattice constant. A layer 206 is disposed on the top surface 204 of substrate 202. Layer 206 has a polished surface 216 with a lattice constant that is different (lattice constant mismatch) from the lattice constant of the top surface 204 of substrate 202. Layer 206 has a bulk defect density 214 of less than 1E7 defects/cm2 and polished surface 216 has a root-mean-square surface roughness of less than 1 nm. A second layer 218 is disposed above the polished surface 216. In one embodiment, second layer is directly on polished surface 216. In another embodiment, an initial layer with a lattice constant approximately equal to the lattice constant of polished surface 216 is disposed on polished surface 216 and second layer 218 is disposed on the initial layer. Second layer 218 has a top surface 220 with a lattice constant.

In an embodiment, second layer 218 is a device layer on which devices such as semiconductor transistors are formed. In one such embodiment, layer 218 has a uniform lattice constant that is approximately equal to the lattice constant of top surface 220. The lattice constant of top surface 220 may be approximately equal to the lattice constant of polished surface 216. For example, second layer 218 may be an InGaAs device layer and layer 206 may be an InP buffer layer, where the InGaAs device layer is lattice matched to the top surface of the InP buffer layer. Because second layer 218 is lattice matched to polished surface 216, second layer 218 may be formed with a low bulk defect density and no subsequent anneal would be necessary for successful device integration and performance. An optional buffing step may subsequent be performed to provide a smooth top surface 220. Alternatively, the lattice constant of top surface 220 may be different (lattice constant mismatch) from the lattice constant of polished surface 216. For example, layer 218 may be a Ge device layer and 206 may be a SiGe buffer layer, where the Ge device layer is lattice-strained as a result of having a larger lattice constant compared to the top surface of the SiGe buffer layer.

In embodiments where second layer 218 is a device layer, second layer 218 may form at least part of a quantum well layer. In an embodiment, second layer 218 is a device layer that forms part of an active area stack that may include a quantum well layer, a gate oxide layer, an upper barrier layer, and a cap layer. In an embodiment, second layer 218 may be a device layer used to fabricate planar or non-planar semiconductor transistors devices. Planar transistor devices may include planar metal oxide semiconductor field effect transistors (MOSFET). Non-planar transistor devices may include fin field effect transistors (FINFET) such as dual-gate transistor devices, tri-gate transistor devices, or gate-all-around (GAA) devices (e.g., nano-wire or nano-ribbon devices). Second layer 218 may also be a device layer used to fabricate semiconductor layers to form a vertical array of multi-channel devices such as gate-all-around multi-nanowire channel devices where a single gate electrode surrounds multiple vertically arranged nanowires.

In a further embodiment, second layer 218 is an additional portion or segment to provide additional lattice grading between layer 206 and a subsequently deposited device layer. In one such embodiment, top surface 220 of second layer 218 has a lattice constant mismatch with polished surface 216. In one embodiment, the lattice constant of top surface 220 is greater than the lattice constant of polished surface 216. In another embodiment, the lattice constant of top surface 220 is smaller than the lattice constant of polished surface 216. The lattice constant mismatch between polished surface 216 and top surface 220 is at least about 1% and in a specific embodiment is between about 2% and 4%. In one embodiment, second layer 218 may have a uniform lattice constant that is equal to the lattice constant of top surface 220. In another embodiment, the lattice constant may change gradually or in a discrete step-wise fashion in second layer 218 between polished surface 216 and top surface 220. In an embodiment, second layer 218 is deposited to a thickness that achieves a lattice constant mismatch between the polished surface 216 and the top surface 220 of second layer 218 of at least 1% and in a specific embodiment between about 2% and 4%.

Figure 3:
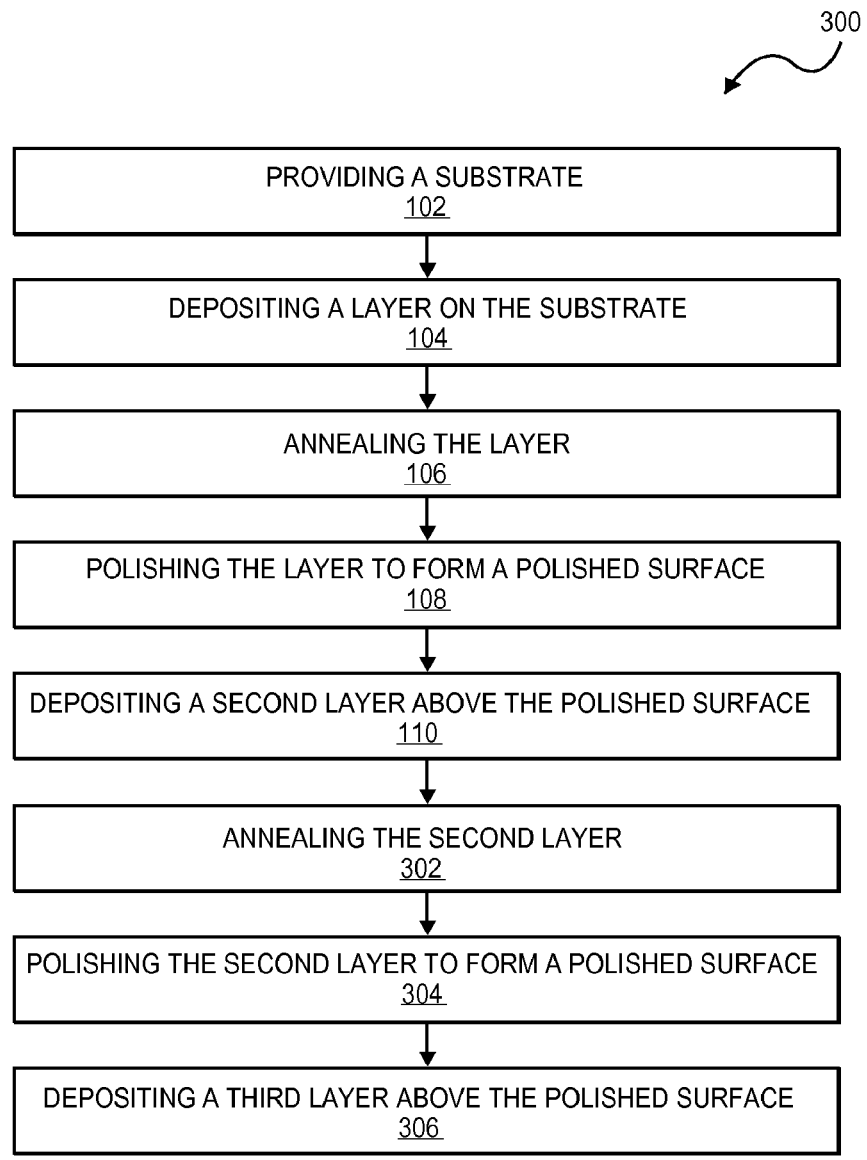
FIG. 3 is a flow chart representing a method of forming hetero-layers with reduced surface roughness and bulk defect density on non-native surfaces, in accordance with an embodiment of the present invention.
Figure 4A:
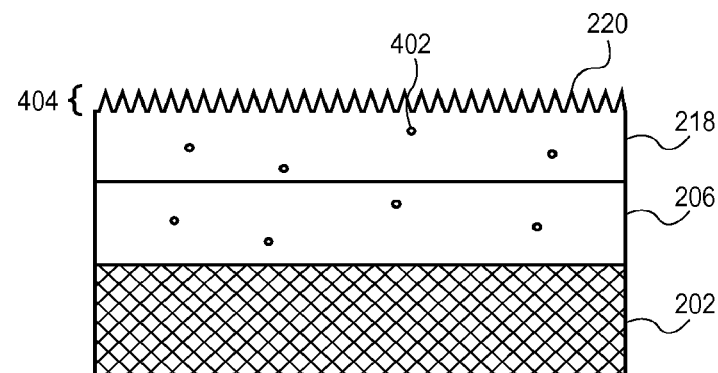
FIG. 4A to 4C illustrate the cross-sectional views representing steps in a method of forming hetero-layers with reduced surface roughness and bulk defect density on non-native surfaces, in accordance with an embodiment of the present invention.
Figure 4B:
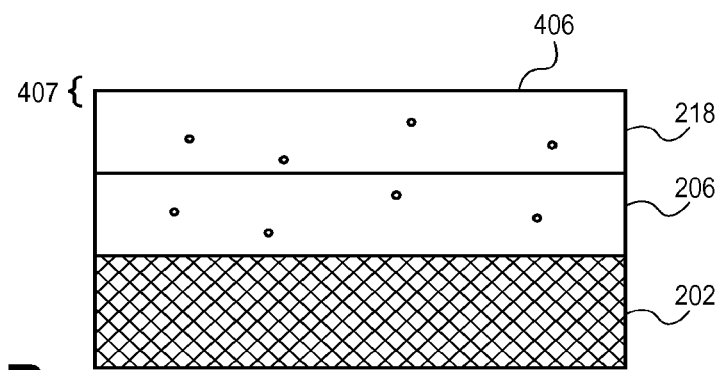
Figure 4C:
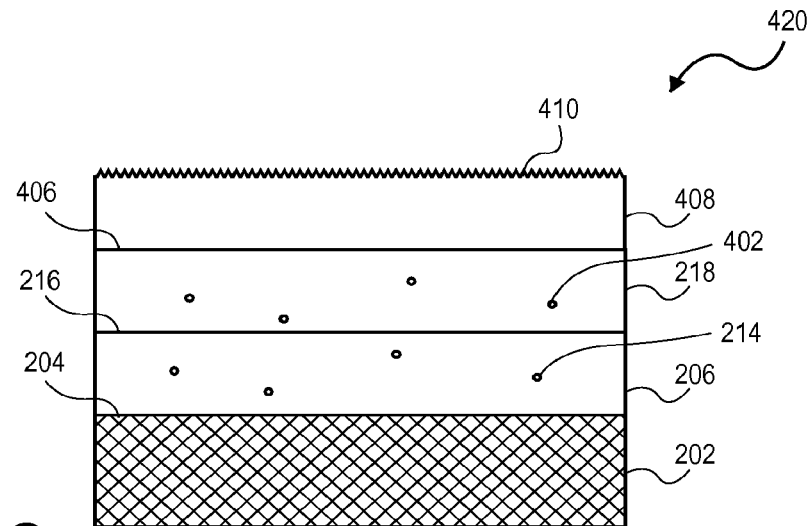

In the further embodiment where second layer 218 is a buffer layer formed between layer 206 and a subsequently deposited device layer, steps 106 through 110 may be repeated after step 110 as represented by steps 302 through 306 in flow chart 300 shown in FIG. 3. FIGS. 4A to 4C are corresponding cross-sectional views illustrating one such embodiment. Steps 102 through 110 have been described earlier. Referring to step 302 in flow chart 300 and corresponding FIG. 4A, second layer 218 is annealed. The description for annealing second layer 218 is analogous to annealing layer 206 in step 106. Second layer 218 may be annealed in an atmosphere rich in Group-V vapor (e.g., arsenic and phosphorus) to promote material stability and maintain stoichiometric ratios. In one embodiment, second layer 218 is annealed at a sufficiently high temperature and for a sufficiently long time to achieve a bulk defect densities 402 that is at least 10 times lower than the initial bulk defect density 222 and/or a RMS surface roughness 404 that is at least 5 times greater than the initial surface roughness 224. In another embodiment, second layer 218 is annealed at a sufficiently high temperature and for a sufficiently long time to achieve a bulk defect density 402 of less than 1E7 defects/cm2 in the second layer 218 and/or a RMS surface roughness 404 on the top surface 220 of second layer 218 that is greater than 20 nm. In particular embodiment, second layer 218 is annealed at a temperature between about 600° C. and 800° C. and for a length of time of about 1 hour to 2 hours. Second layer 218 may be annealed in the same chamber (in-situ) in which the second layer 218 was deposited.

Referring to step 304 in flow chart 300 and corresponding FIG. 4B, second layer 218 is polished to form a polished surface 406 having a lattice constant. The description for polishing second layer 218 is analogous to polishing layer 206 in step 108. The polished surface 406 has a RMS surface roughness 407 that is significantly lower than the RMS surface roughness 404 after annealing. In one embodiment, the polished surface 406 has a root-mean-square (RMS) surface roughness of less than 1 nm. Ideally, polished surface 406 has a RMS surface roughness of less than 0.5 nm. In a specific embodiment, polished surface 406 has a RMS surface roughness of less than 1 nm and a peak-to-valley surface roughness range of less than 10 nm While not shown in FIG. 4B, an oxide layer may form on the polished surface 406 of second layer 218 as a result of exposing second layer 218 to water and air during the polishing process in step 304. In one embodiment, an oxide layer is removed from the polished surface 406 prior to the subsequent step 306 of depositing the third layer 408.

Referring to step 306 in flow chart 300 and corresponding FIG. 4C, a third layer 408 is deposited above polished surface 406. Third layer 408 has a top surface 410 with a lattice constant. The description for depositing third layer 408 is analogous to depositing layer 218 in step 110. In one embodiment, third layer 408 may be deposited directly on polished surface 406. In another embodiment, an initial layer (not shown) may be deposited on polished surface 406 prior to depositing third layer 408. The initial layer may serve as a transition between second layer 218 and third layer 408 where the initial layer has a lattice constant approximately equal to the lattice constant of polished surface 406. Third layer 408 may be an epitaxially grown semiconductor crystalline film such as, GaAs, SiGe, GaAsSb, AlAsSb, AlGaSb, GaSbP, InAlAs, InGaAs, and InP, in an embodiment. In an embodiment, third layer 408 is a device layer on which devices such as semiconductor transistors are formed. In such an embodiment, third layer 408 has a uniform lattice constant that is approximately equal to the lattice constants of top surface 410. The lattice constant of top surface 410 may be approximately equal to or different from the lattice constant of polished surface 406. In a particular embodiment, the substrate 202 is a single crystalline silicon substrate, layer 206 is a $Si_{0.7}Ge_{0.3}$ buffer layer, second layer 218 is a $Si_{0.3}Ge_{0.7}$ buffer layer, and third layer 408 is a Ge device layer. While not shown in FIG. 4C, forming a fully completed device may further include forming a quantum well layer, a spacer layer, a doping layer, an upper barrier layer, and a contact capping layer.

In a further embodiment, third layer 408 may be a third buffer layer to provide additional lattice grading between second layer 218 and a subsequently deposited device layer. In such an embodiment, steps 302 through 306 may be repeated one or more times to form additional polished layers with reduced bulk defect density and reduced surface roughness above layer 408. In such an embodiment, the lattice constant of top surface 410 may be different from the lattice constant of polished surface 406. Third layer 408 may have a uniform lattice constant that is equal to the lattice constant of top surface 410. Alternatively, third layer 408 may have a graded lattice constant that changes with thickness.

The method described in flow chart 300 formed the structure 420 shown in FIG. 4C. Structure 420 comprises the previously described structure 230 shown in FIG. 2E. In addition, second layer 218 has a polished surface 406 with a lattice constant. Second layer 218 has a bulk defect density 402 of less than 1E7 defects/cm2 and polished surface 406 has a RMS surface roughness of less than 1 nm. In an embodiment, the lattice constant of polished surface 406 is different from the lattice constant of polished surface 216. A third layer 408 having a top surface 410 with a lattice constant is disposed above polished surface 406.

Figure 5:
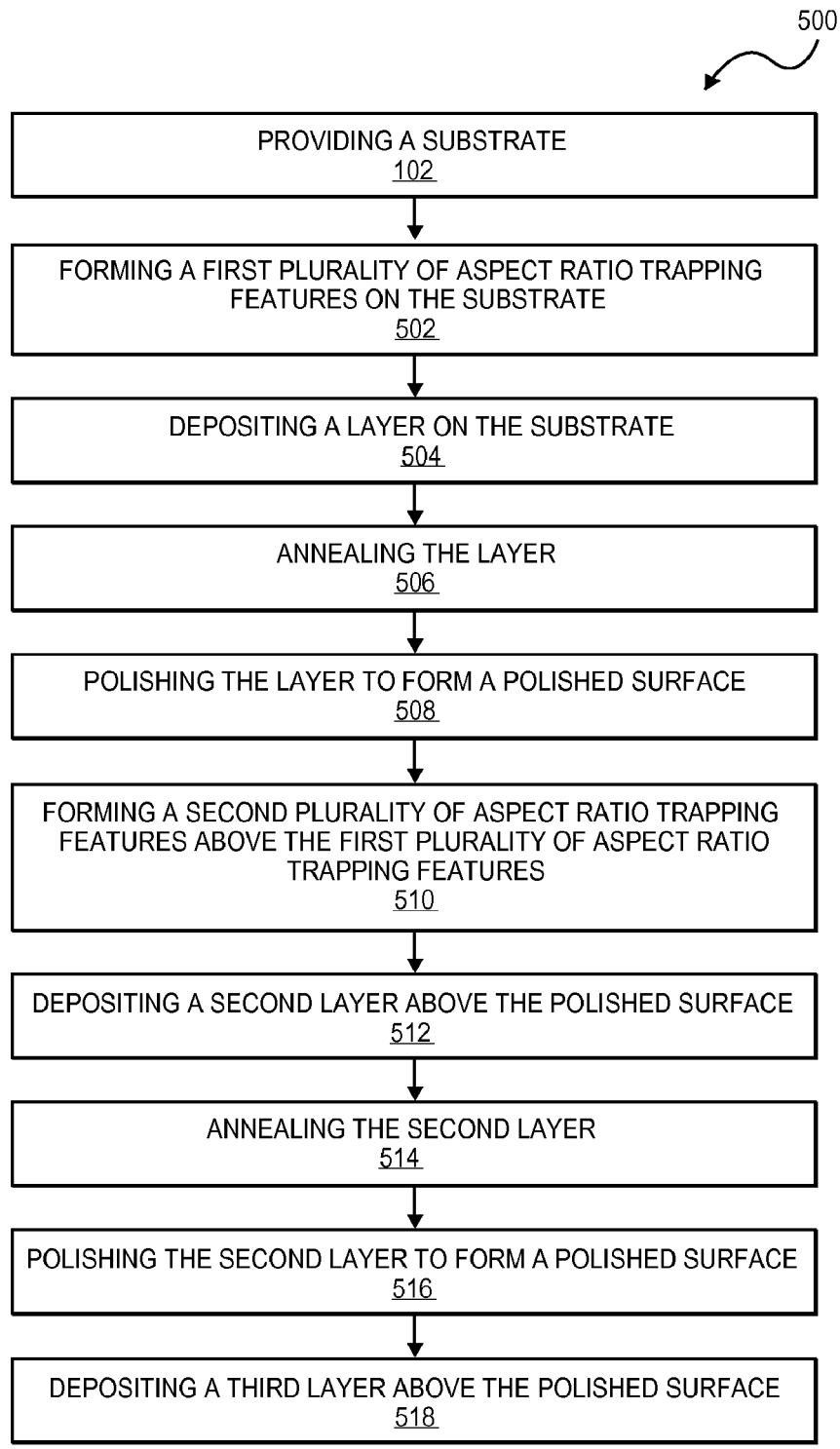
FIG. 5 is a flow chart representing a method of forming hetero-layers with reduced surface roughness and bulk defect density on non-native surfaces, in accordance with an embodiment of the present invention.
Figure 6A:
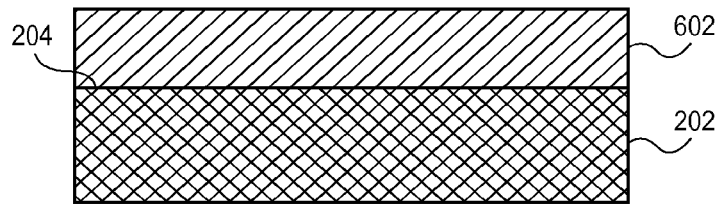
FIG. 6A to 6K illustrate the cross-sectional views representing steps in a method of forming hetero-layers with reduced surface roughness and bulk defect density on non-native surfaces, in accordance with an embodiment of the present invention.
Figure 6B:
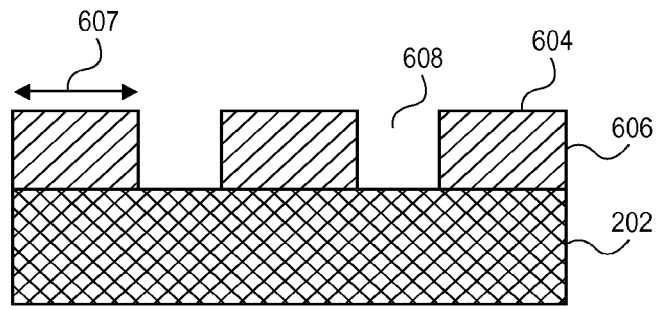

In additional embodiments of the present invention, aspect ratio trapping (ART) features may be formed. The ART features serve to prevent bulk defects in the substrate and the underlying layers from migrating to a subsequently formed device layer by providing non-crystalline sidewalls at which defects may terminate. FIG. 5 is a flow chart 500 representing a method of forming hetero-layers with reduced surface roughness and bulk defect density on non-native surfaces according to one such embodiment. FIGS. 6A to 6K are corresponding cross-sectional views illustrating one such embodiment. Steps 102 of providing a substrate 202 has been previously described in detail. Referring to step 502 and corresponding FIG. 6A, the method further comprises forming a first plurality of ART features 606 on the top surface 204 of substrate 202. The first plurality of ART features 606 may comprise any well-known material having a non-nucleating surface on which semiconductor epitaxial films do not grow. Ideally, first plurality of ART features 606 are formed from a dielectric material (e.g., $SiO_2$, doped $SiO_2$, SiON, SiN, SiC, SiCN, and SiOC). First plurality of ART features may be formed by first depositing a dielectric layer 602 on top surface 204 of substrate 202 as shown in FIG. 6A. Dielectric layer 602 may be patterned using conventional photolithography and etching methods to form ART features 606 having widths 607, as shown in FIG. 6B. The first plurality of ART features 606 are patterned such that they are spaced apart to form a first plurality of ART trenches 608. In an embodiment, the spacing between the first plurality of ART feature 606 is sufficient to form at least 10 semiconductor devices over each ART trench 608. In a specific embodiment, the spacing between the first plurality of ART features 606 is between about 50-100 nm. In an embodiment, the first plurality of ART trenches have aspect ratios greater than 1. The aspect ratio of a trench is the ratio of the depth of the trench to the width of the trench.

Figure 6C:
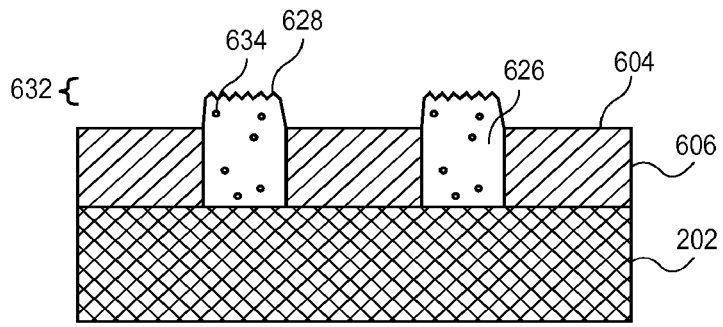

Referring to step 504 in flow chart 500 and corresponding FIG. 6C, layer 626 is deposited on top surface 204 of substrate 202 and in the first plurality of ART trenches 608. Step 504 in flow chart 500 is analogous to step 104 in flow chart 100. Thus, the description of layer 626 is similar to the description of layer 206 in FIG. 2B. Layer 626 does not form on the top surface 604 of the first plurality of ART features 606. Layer 626 is deposited to a thickness sufficiently above top surface 604 to enable subsequent polishing to form a polished surface 636 that is approximately planar to top surface 604. Layer 626 has an initial bulk defect density 630 and an initial surface roughness 632.

Figure 6D:
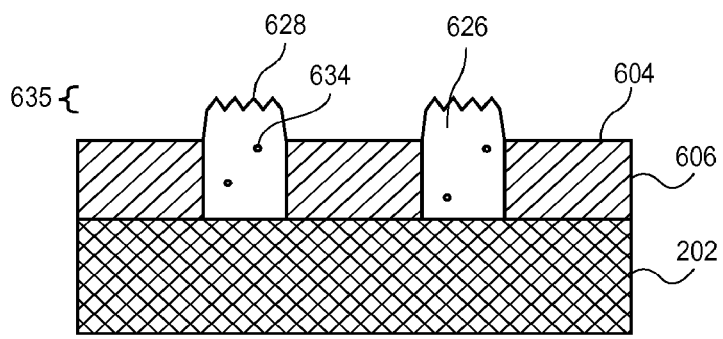

Referring to step 506 in flow chart 500 and corresponding FIG. 6D, layer 626 is then annealed. The description of the annealing process for step 506 is similar to the annealing process previously described in step 106 of flow chart 100. In one embodiment, layer 626 is annealed at a sufficiently high temperature and for a sufficiently long time to achieve a bulk defect densities 634 that is at least 10 times lower than the initial bulk defect density 630 and/or a RMS surface roughness 635 that is at least 5 times greater than the initial surface roughness 632. In another embodiment, layer 626 is annealed at a sufficiently high temperature and for a sufficiently long time to achieve a bulk defect density 634 of less than 1E7 defects/cm2 in the layer 626 and/or a RMS surface roughness on the top surface 628 of layer 626 that is greater than 20 nm. In particular embodiment, layer 626 is annealed at a temperature between about 600° C. and 800° C. and for a length of time of about 1 hour to 2 hours.

Figure 6E:
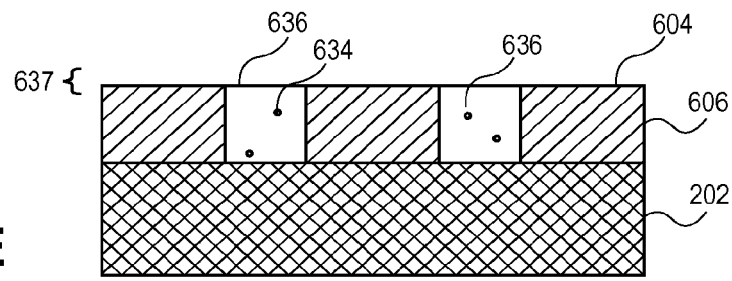
Figure 6F:
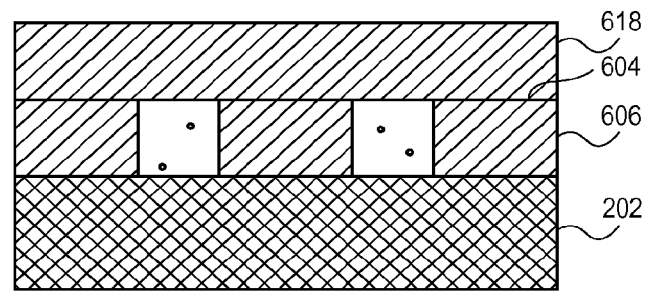
Figure 6G:
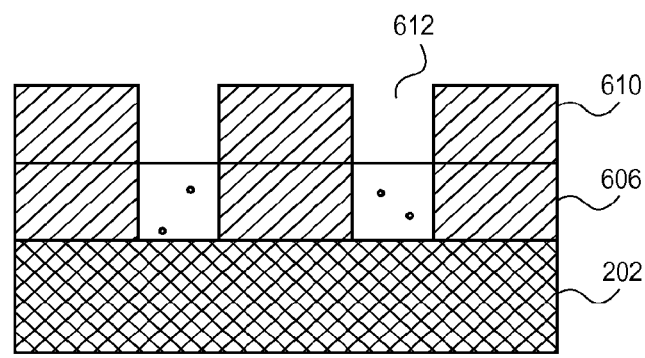

Referring to step 508 in flow chart 500 and corresponding FIG. 6E, layer 626 is then polished to form polished surface 636. The description of the polishing process for step 508 is similar to the polishing process previously described in step 108 of flow chart 100. During polishing, layer 626 is polished down such that polished surface 636 is approximately planar to top surface 604. In one embodiment, polished surface 636 has a RMS surface roughness 637 of less than 1 nm Ideally, polished surface 636 has a RMS surface roughness 637 of less than 0.5 nm. In a specific embodiment, polished surface 636 has a RMS surface roughness of less than 1 nm and a peak-to-valley surface roughness range of less than 10 nm In a further embodiment, a second plurality of ART features 610 may be formed above the first plurality of ART features 606. The second plurality of ART features 610 are formed in a similar manner as the first plurality of ART features 604. Second plurality of ART features 610 may be formed from similar non-nucleating non-crystalline materials as first plurality of ART features 606. Second plurality of ART features 610 may be formed by first depositing a dielectric layer 608 (e.g., $SiO_2$, doped $SiO_2$, SiON, SiN, SiC, SiCN, and SiOC) on top surface 604 and polished surface 216 as shown in FIG. 6F. The dielectric layer 618 may then be patterned using conventional photolithography and etching methods to form the second plurality of ART features 610, as shown in FIG. 6G. The second plurality of ART features 610 are spaced apart to form a second plurality of ART trenches 612. In an embodiment, the spacing between the second plurality of ART feature 610 is sufficient to form at least 10 semiconductor devices over each ART trench 612. In a specific embodiment, the spacing between the second plurality of ART features 610 is between about 50-100 nm. In an embodiment, the second plurality of ART trenches 612 have aspect ratios greater than 1.

Figure 6H:
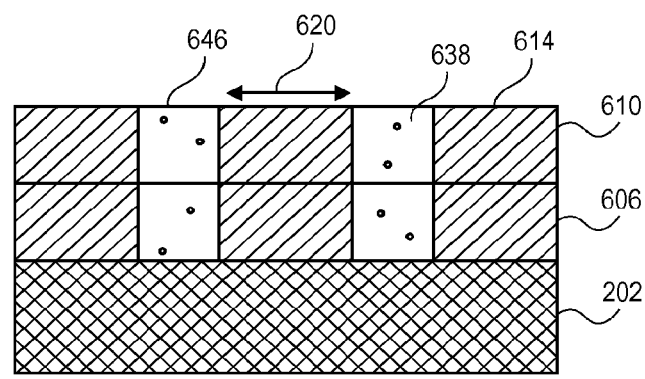

Next, steps 504 through 508 are the repeated after step 510 as represented by steps 512 through 516 in flow chart 500. Referring to step 512 in flow chart 500, a second layer 638 is deposited above polished surface 636 and in the second plurality of ART trenches 612. In one embodiment, second layer 638 is deposited directly on polished surface 636. In another embodiment, an initial layer (not shown) may be deposited on polished surface 636 prior to depositing second layer 638. The initial layer may serve as a transition between layer 626 and second layer 638 where the initial layer has a lattice constant approximately equal to the lattice constant of polished surface 636. Second layer 638 does not form on top surface 614 of the second plurality of ART features 610. Second layer 638 is deposited to a thickness sufficiently above top surface 614 to enable subsequent polishing to form a polished surface 646 that is approximately planar to top surface 614. Referring to steps 514 and 516, second layer 638 is annealed and polished to form polished surface 646, as shown in FIG. 6H. The description of steps 512 through 516 is similar to the previous description of steps 504 through 508 in flow chart 500. In an embodiment, polished surface 646 formed in step 516 of flow chart 500 is approximately planar to top surface 614. Next, in step 518 of flow chart 500, a third layer 648 is deposited above polished surface 646. In an embodiment, as shown in FIG. 6I, layer 648 may be deposited directly on polished surface 646 and may grow and coalesce to form a single continuous layer on polished surface 646 and top surface 614.

Figure 6I:
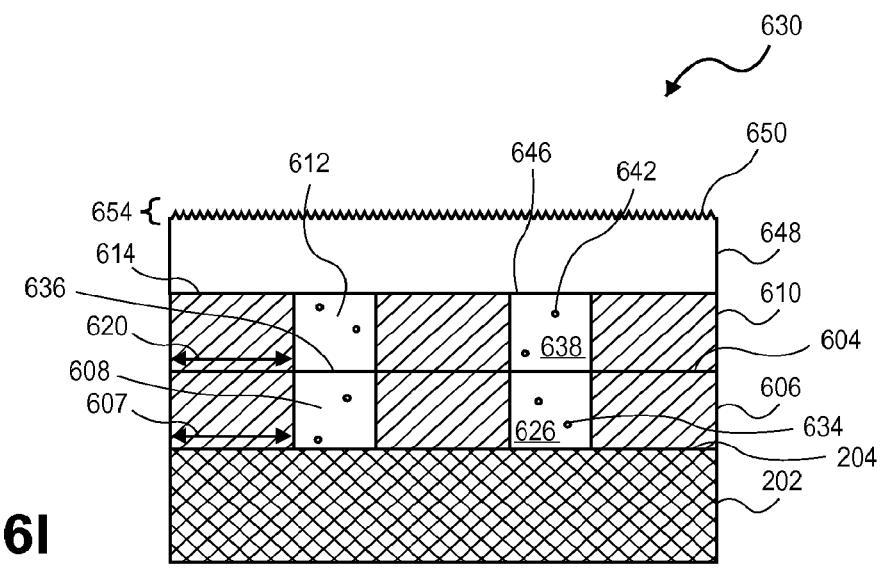
Figure 6J:
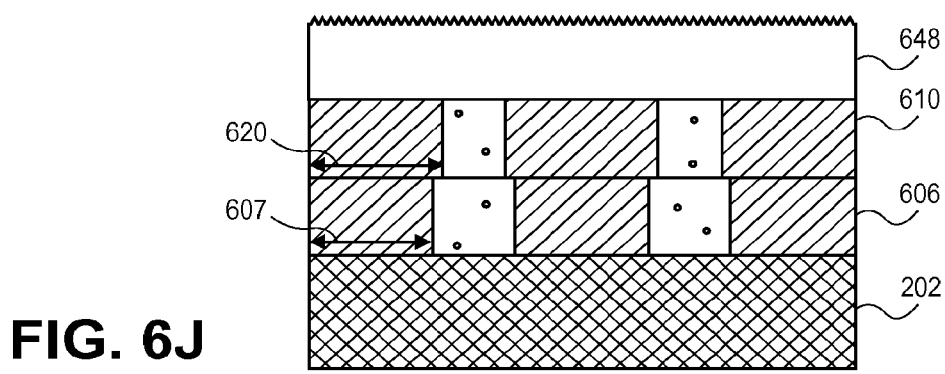

In an embodiment, as shown in FIG. 6I, the second plurality of ART features 610 are patterned such that they are aligned with the first plurality of ART features 606. In such an embodiment, the second plurality of ART features 610 may have widths 620 that are approximately equal the width 607 of the first plurality of ART features. Alternative, as shown in FIG. 6J, the second plurality of ART features 610 may have widths 622 that are greater than the width 607 of the first plurality of ART features.

Figure 6K:
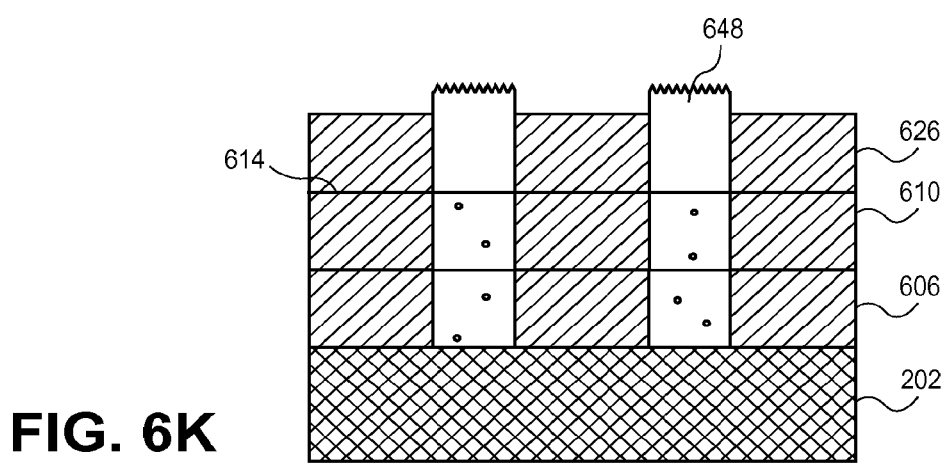

In yet another embodiment, as shown in FIG. 6K, a third plurality of ART features 660 may be formed on the top surface 614 using a similar method as described in step 510 of flow chart 500. Third plurality of ART feature 660 may be spaced out to form a third plurality of ART trenches between third plurality of ART features 660. In such an embodiment, third layer 648 is deposited above polished surface 646 and in the third plurality of ART trenches between the third plurality of ART features 660.

In an embodiment of the present invention, structure 630 as shown in FIG. 6I, is formed by the method represented in flow chart 500. Structure 630 includes a substrate 202 having a top surface 204 with a lattice constant. A first plurality of ART features 606 is disposed on the top surface 204 of substrate 202. The first plurality of ART features 606 are spaced apart to form a first plurality of ART trenches 608. A layer 626 is disposed on the top surface 204 of substrate 202 and in the first plurality of ART trenches 608. Layer 626 has a polished surface 636 with a lattice constant that is different from the lattice constant of the top surface 204 of substrate 202. Layer 626 has a bulk defect density 634 of less than 1E7 defects/cm2 and polished surface 636 has a root-mean-square surface roughness of less than 1 nm. The first plurality of ART features 606 have top surfaces 604 that are approximately planar with polished surface 636 of layer 626. A second plurality of ART features 610 are disposed above and aligned with the first plurality of ART features 606. The second plurality of ART features 610 form a second plurality of ART trenches 612. A second layer 638 is disposed above polished surface 636 and in the second plurality of ART trenches 612. Second layer 638 has a polished surface 646 with a lattice constant. In an embodiment, the lattice constant of polished surface 646 is different from the lattice constant of polished surface 636. Second layer 638 has a bulk defect density 642 of less than 1E7 defects/cm2 and polished surface 646 has a RMS surface roughness of less than 1 nm. A third layer 648 is disposed above the polished surface 646 and the top surface 614 of the second plurality of ART features 610. Third layer 648 has a top surface 650 with a lattice constant.

Figure 7:
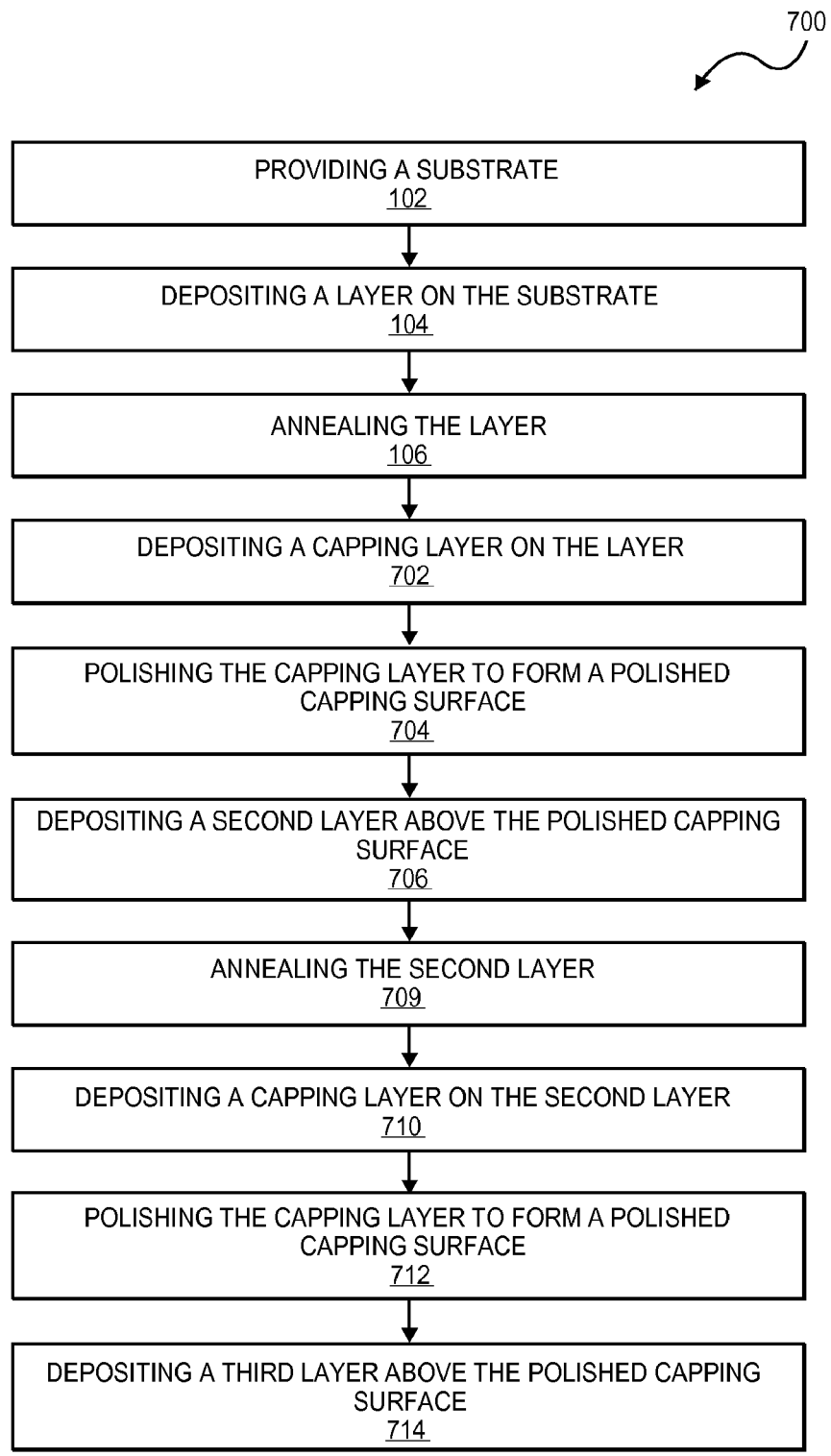
FIG. 7 is a flow chart representing a method of forming hetero-layers with reduced surface roughness and bulk defect density on non-native surfaces, in accordance with an embodiment of the present invention.

As previously described, an oxide layer may form as a result of exposing the layer to water and air during polishing. For successful subsequent device integration and performance, the oxide layer may need to be removed from the polished surface prior to subsequent processing steps. However, in certain embodiments, the layer may comprise of a material (e.g., aluminum-containing compounds) that forms an oxide layer that is not easily removed using cost-effective and manufacturable methods. In such embodiments, a capping layer may need to be deposited over the layer prior to the polishing process. The capping layer comprises of any well-known material having a lattice constant that, when exposed to water and air during polishing, forms an oxide that can be removed using cost-effective and manufacturable methods. Embodiments of the present invention may include depositing such a capping layer. FIG. 7 is a flow chart 700 representing a method of forming hetero-layers with reduced surface roughness and bulk defect density on non-native surfaces, according to one such embodiment. FIGS. 8A to 8G are corresponding cross-sectional views illustrating one such embodiment. Referring to FIG. 7, steps 102 through 106 in flow chart 700 have been previously described in detail. Referring to step 702 in flow chart 700 and corresponding FIG. 8A, the method further comprises depositing a capping layer 802 on the top surface 208 of layer 206. Capping layer 802 serves as a barrier that prevents layer 206 from oxidizing during polishing. When exposed to an oxidizing agent (e.g., water, oxygen, ozone, CO, etc.) during polishing, the capping layer 802 forms an oxide that may be removed using cost-effect and manufacturable methods, such as conventional chemical etching methods. Ideally, capping layer 802 is a single crystalline semiconductor material such as, but not limited to, GaAs, SiGe, GaAsSb, GaSbP, InGaAs, and InP. Capping layer 802 may be deposited in a conventional molecular beam epitaxy or epitaxial chemical vapor deposition chamber using conventional methods. The deposition and anneal of layer 206 and the deposition of capping layer 802 may be performed in the same chamber and in consecutive processing steps. In an embodiment, capping layer 802 may have a uniform lattice constant that is approximately equal to the lattice constant of the top surface 208 of layer 206. Because of the lattice matching between capping layer 802 and the top surface 208 of layer 206, capping layer 802 is deposited having a low initial bulk defect density 804 that will not interfere with subsequent device integration or performance. The deposited capping layer 802 may conform to the surface roughness 215 of layer 206 post-anneal and may itself have significant initial surface roughness 806 on the top surface 808. Capping layer 802 is deposited to a thickness that is sufficient to achieve a polished capping surface 610 after subsequent polishing step 704 that does not expose any part of layer 206 to oxidation.

Figure 8A:
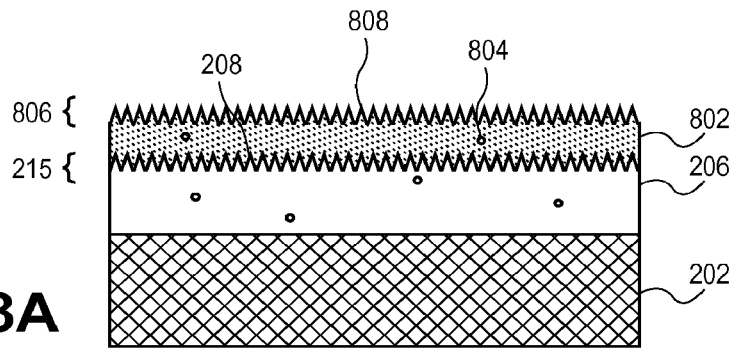
FIG. 8A to 8G illustrate the cross-sectional views representing steps in a method of forming hetero-layers with reduced surface roughness and bulk defect density on non-native surfaces, in accordance with an embodiment of the present invention.
Figure 8B:
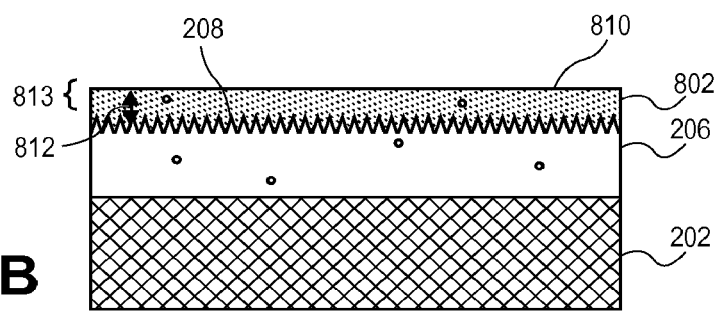

Referring to step 704 in flow chart 700 and corresponding FIG. 8B, capping layer 802 is polished to form a polished capping surface 810. Capping layer 802 may be polished in a conventional chemical mechanical polishing (CMP) apparatus using conventional methods. During polishing, the top surface 808 is polished away and the thickness of capping layer 802 is reduced. In an embodiment, capping layer 802 is polished to a remaining thickness 812 that is sufficiently thick to prevent the top surface 208 from oxidizing during polishing, but is sufficiently thin to not interfere with subsequent device integration or performance. Polished capping surface 810 has a surface roughness 813 that is significantly lower than the initial surface roughness 806. In one embodiment, the polished capping surface 810 has a RMS surface roughness of less than 1 nm. In another embodiment, the polished capping surface 810 has a RMS surface roughness of less than 0.5 nm. In a specific embodiment, the polished capping surface 810 has a RMS surface roughness of less than 1 nm and a peak-to-valley surface roughness range of less than 10 nm. The peak-to valley surface roughness range is the distance between the highest and lowest topographic points on polished capping surface 810.

While not shown in FIG. 8B, an oxide layer may form on the polished capping surface 810 as a result of exposing capping layer 802 to water and air during the polishing process in step 704 in flow chart 700. For successful subsequent device integration and performance, the oxide layer may need to be removed from the polished capping surface 810 prior to subsequent processing steps. In one embodiment, an oxide layer is removed from the polished capping surface 810 prior to the subsequent step 706 of depositing a second layer 218. Ideally, the oxide layer is removed in the same chamber (in-situ) in which second layer 218 is subsequently deposited. In an embodiment, the oxide layer is removed using cost-effect and manufacturable methods. For example, the oxide layer may be removed using conventional dry etching methods with conventional dry etching gas chemistries.

Figure 8C:
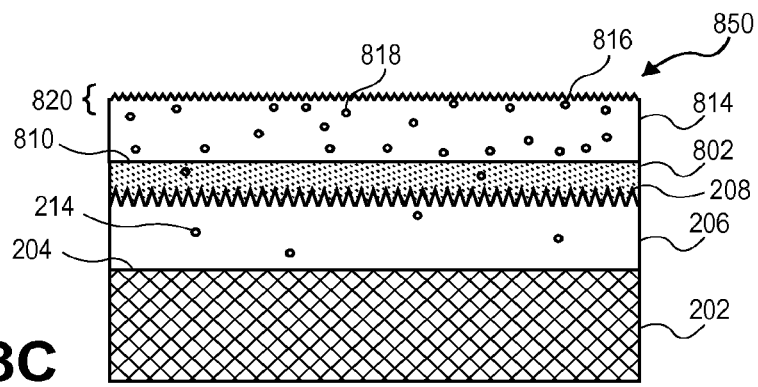
Figure 8D:
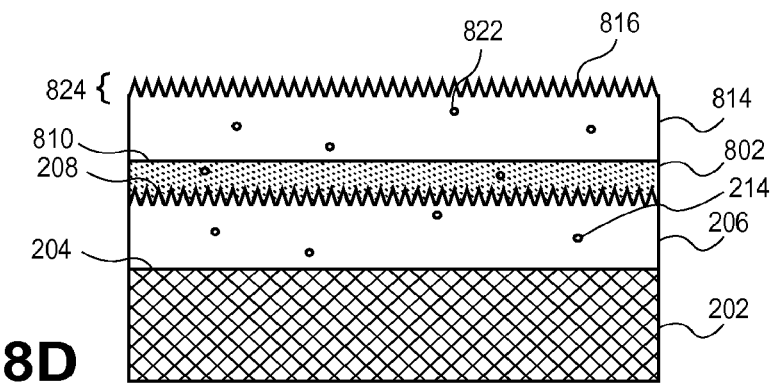

Referring to step 706 in flow chart 700 and corresponding FIG. 8C, a second layer 814 is deposited above the polished capping surface 810. In one embodiment, second layer 814 may be deposited directly on polished capping surface 810. In another embodiment, an initial layer (not shown) may be deposited on polished capping surface 810 prior to depositing second layer 814. The initial layer may serve as a transition between polished capping surface 810 and second layer 814 where the initial layer has a lattice constant approximately equal to the lattice constant of polished capping surface 810. In one embodiment, second layer 814 is an epitaxially grown semiconductor crystalline film such as, but not limited to GaAs, SiGe, GaAsSb, AlAsSb, AlGaSb, GaSbP, InAlAs, InGaAs, and InP. Second layer 814 may be deposited in a conventional epitaxial chemical vapor deposition chamber using conventional methods. Second layer 814 has a top surface 816 with a lattice constant. In one embodiment, the lattice constant of top surface 816 is approximately equal to the lattice constant of the polished capping surface 810. In another embodiment, top surface 816 of second layer 814 has a lattice mismatch with polished capping surface 810. In an embodiment, the lattice constant mismatch between the polished capping surface 810 and the top surface 816 of second layer 814 is at least about 1% and in a specific embodiment is between about 2% and 4%. Second layer 814 may be deposited to a thickness that achieves a lattice constant mismatch between the polished capping surface 810 and the top surface 816 of second layer 814 of at least about 1% and in a specific embodiment, between about 2% and 4%. Second layer 814 has an initial bulk defect density 818 and an initial surface roughness 820.

In a further embodiment of the present invention, steps 106, 702, 704, and 706 in flow chart 700 may be repeated after step 706 as represented by steps 708, 710, 712, and 714. Referring to step 708 in flow chart 700 and corresponding FIG. 8D, second layer 814 is annealed. The description for annealing second layer 814 is analogous to annealing layer 206 in step 106 of flow chart 100. In one embodiment, second layer 814 is annealed at a sufficiently high temperature and for a sufficiently long time to achieve a bulk defect densities 822 that is at least 10 times lower than the initial bulk defect density 818 and a RMS surface roughness 824 that is at least 5 times greater than the initial surface roughness 820. In an embodiment, second layer 814 is annealed at a sufficiently high temperature and for a sufficiently long time to achieve a bulk defect density 822 of <1E7 defects/cm2 and a RMS surface roughness 824 that is greater than 20 nm. In a particular embodiment, second layer 814 is annealed at a temperature between about 600° C. and 800° C. and for a length of time of about 1 hour to 2 hours.

Figure 8E:
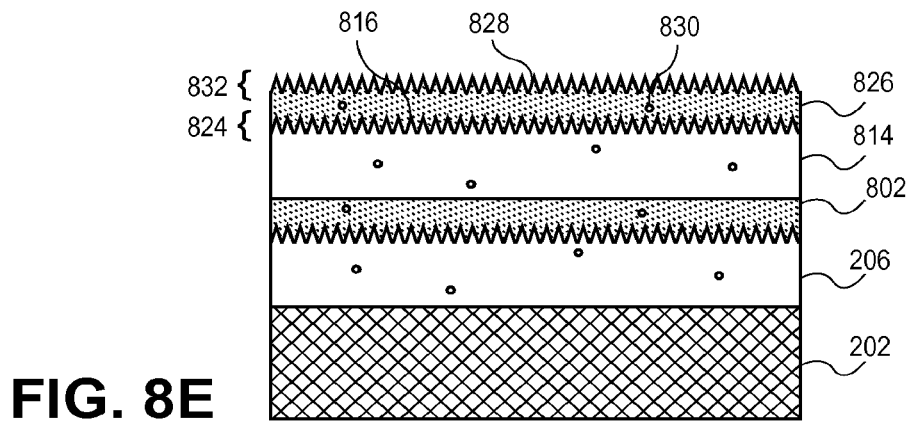

Referring to step 710 in flow chart 700 and corresponding FIG. 8E, the method further comprises depositing a capping layer 826 on the top surface 816 of second layer 814. The description of depositing capping layer 826 on the top surface 816 is analogous to the description of depositing capping layer 802 on the top surface 208. In an embodiment, capping layer 826 comprises any well-known material having a lattice constant which, when exposed to water and air during polishing, forms an oxide that can be removed using cost-effective and manufacturable methods. Ideally, capping layer 826 is an epitaxially grown semiconductor crystalline film such as, but not limited to, GaAs, SiGe, GaAsSb, GaSbP, InGaAs, and InP. In an embodiment, capping layer 826 may have a uniform lattice constant that is approximately equal to the lattice constant of the top surface 816 of second layer 814. Capping layer 826 is deposited to a thickness that is sufficient to achieve a polished capping surface 836 after subsequent polishing step 712 that does not expose any part of second layer 814 to oxidation.

Figure 8F:
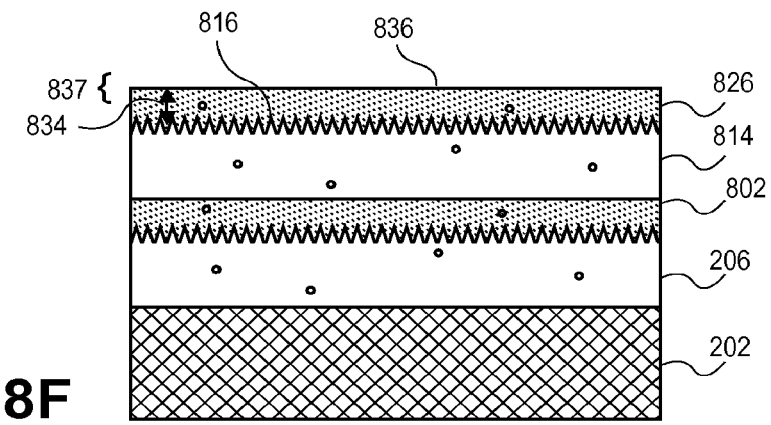

Referring to step 712 in flow chart 700 and corresponding FIG. 8F, capping layer 826 is polished to form a polished capping surface 836. The description of polishing capping layer 826 is similar to the earlier description of polishing capping layer 802. In an embodiment, capping layer 826 is polished to a remaining thickness 834 that is sufficiently thick to prevent the top surface 816 from oxidizing during polishing, but is sufficiently thin to not interfere with device integration or performance. The polished capping surface 836 formed has a RMS surface roughness 837 that is significantly lower than the initial RMS surface roughness 832. In an embodiment, the polished capping surface 836 has a RMS surface roughness of less than 1 nm In another embodiment, the polished capping surface 836 has a RMS surface roughness of less than 0.5 nm. In a specific embodiment, the polished capping surface 836 has a RMS surface roughness of less than 1 nm and a peak-to-valley surface roughness range of less than 10 nm Similar to polished capping surface 810, an oxide layer (not shown) may form on polished capping surface 836 as a result of exposing capping layer 826 to water and air during the polishing process in step 712 of flow chart 700. In an embodiment, such an oxide layer is removed from the polished capping surface 836 prior to the subsequent step 714 in flow chart 700 of depositing a third layer 838 above the polished capping surface 836.

Figure 8G:
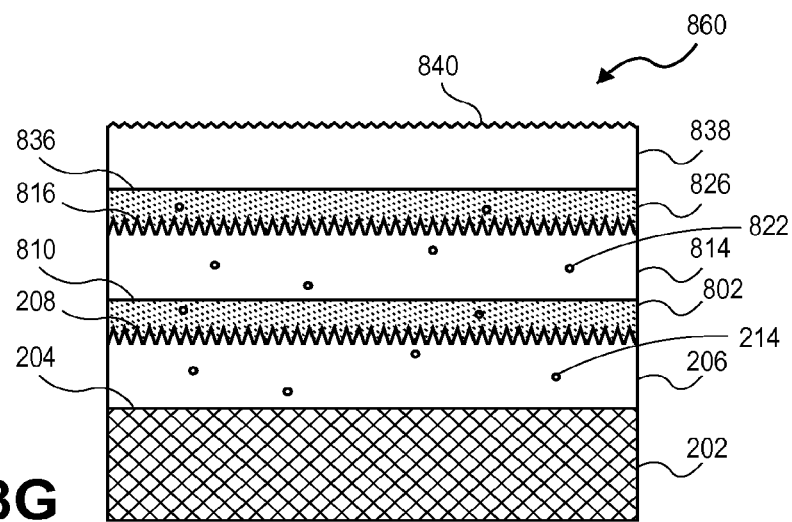

Referring to step 714 in flow chart 700 and corresponding FIG. 8G, a third layer 838 is deposited above polished capping surface 836. The description of depositing third layer 838 is analogous to the earlier description of depositing second layer 814. In one embodiment, third layer 838 is an epitaxially grown semiconductor crystalline film such as, GaAs, SiGe, GaAsSb, AlAsSb, AlGaSb, GaSbP, InAlAs, InGaAs, and InP. Third layer 838 may be deposited in a conventional epitaxial chemical vapor deposition chamber using conventional methods. Third layer 838 has a top surface 840 with a lattice constant. In one embodiment, the lattice constant of top surface 840 is approximately equal to the lattice constant of polished capping surface 836. In another embodiment, top surface 840 of third layer 838 has a lattice constant mismatch with polished capping surface 836. In an embodiment, the lattice constant mismatch between polished capping surface 836 and top surface 840 of third layer 838 is at least about 1% and in a specific embodiment is between about 2% and 4%. In an embodiment, third layer 838 may be deposited to a thickness that achieves a lattice constant mismatch between the polished capping surface 836 and the top surface 840 of third layer 838 of at least about 1% and in a specific embodiment, between about 2% and 4%.

The structure 850 shown in FIG. 8C is formed by the method represented in flow chart 700, in an embodiment. Structure 850 includes a substrate 202 having a top surface 204 with a lattice constant. A layer 206 is disposed on the top surface 204 of substrate 202 and has a bulk defect density 214 of less than 1E7 defects/cm2. Layer 206 has a top surface 208 with a lattice constant that is different from the lattice constant of the top surface 204 of substrate 202. A capping layer 802 is disposed on the top surface 208 of layer 206. Capping layer 802 has a lattice constant that is approximately equal to the lattice constant of top surface 208 and has a polished capping surface 810 with a root-mean-square surface roughness of less than 1 nm. A second layer 814 is disposed above polished capping surface 810. In one embodiment, second layer 814 is disposed on polished capping surface 810. In another embodiment, one or more other layers may be disposed between polished capping surface 810 and layer 814. Second layer 814 has a top surface 816 with a lattice constant.

In a further embodiment, as shown in FIG. 8G, structure 860 is formed by the method represented in flow chart 700. Structure 860 comprises of structure 850 in FIG. 8C. in addition, second layer 814 has a bulk defect density 822 of less than 1E7 defects/cm2. Structure 860 further comprises a capping layer 826 disposed on the top surface 816 of second layer 814, as shown in FIG. 8G. Capping layer 826 has a lattice constant that is approximately equal to the lattice constant of top surface 816 and has a polished capping surface 836 with a root-mean-square surface roughness of less than 1 nm. A third layer 838 having a top surface 840 with a lattice constant is disposed above polished capping surface 836.

Figure 9A:
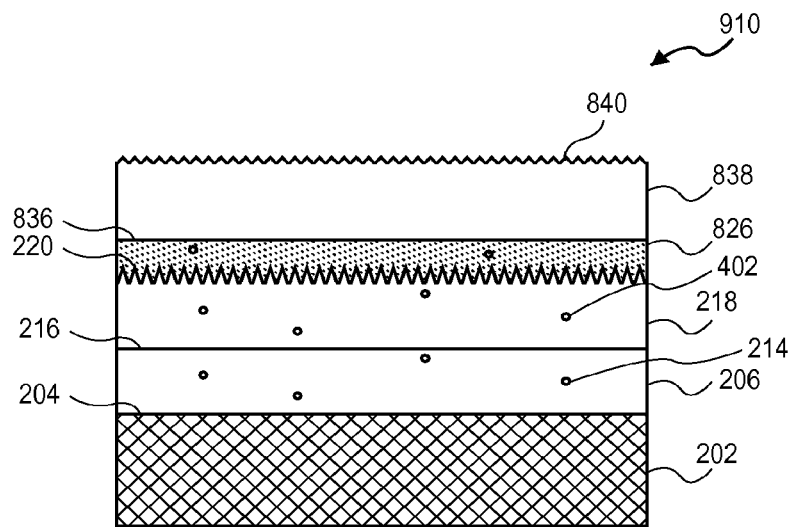
FIGS. 9A and 9B illustrate cross-sectional views of structures formed using methods of forming hetero-layers with reduced surface roughness and bulk defect density on non-native surfaces, in accordance with an embodiment of the present invention.

Further embodiments of methods for forming heterolayers with reduced surface roughness and bulk defect density on non-native surfaces may include repeating steps 708 through 714 in flow chart 700 one or more times to form additional layers and/or capping layers with reduced surface roughness and bulk defect density above layer 838. Further embodiments of the present invention may also include different combinations of the steps described in flow charts 300, 500, and 700. For example, in an embodiment shown in FIG. 9A, a method may include first forming a layer 206 with a low bulk defect density 214 and a polished surface 216 on the top surface 204 of substrate 202 and then forming a second layer 218 on polished surface 216 by following steps 102 through 110 of flow chart 300. The bulk defect density of second layer 218 may then be reduced and a capping layer 826 with a polished capping surface may be formed on second layer 218 by following steps 708 through 712 in flow chart 700. Finally a third layer 838 may be formed above layer 218 by following step 714 in flow chart 700. The resultant structure 910 formed using such a described method is shown in FIG. 9A. Structure 910 includes a substrate 202 having a top surface 204 with a lattice constant. A layer 206 is disposed on the top surface 204 of substrate 202. Layer 206 has a polished surface 216 with a lattice constant that is different from the lattice constant of the top surface 204 of substrate 202. Layer 206 has a bulk defect density 214 of less than 1E7 defects/cm2 and polished surface 216 has a root-mean-square surface roughness of less than 1 nm. A second layer 218 having a top surface 220 with a lattice constant is disposed above polished surface 216. In an embodiment, the lattice constant of top surface 204 is different from the lattice constant of polished surface 216. Second layer 218 has a bulk defect density 402 of less than 1E7 defects/cm2. A capping layer 826 is disposed on the top surface 220 of layer 218. Capping layer 826 has a lattice constant that is approximately equal to the lattice constant of top surface 220 and has a polished capping surface 836 with a root-mean-square surface roughness of less than 1 nm. A third layer 838 having a top surface 840 with a lattice constant is disposed above polished capping surface 836. In one embodiment, the lattice constant of top surface 840 is approximately equal to the lattice constant of polished capping surface 836. In another embodiment, the lattice constant of top surface 840 is different from the lattice constant of polished capping surface 836. In a specific embodiment, substrate 202 is a single crystalline silicon substrate, layer 206 is a GaAs buffer layer, layer 218 is a $In_XAl_{1-X}As$ buffer layer, where X ranges from 0-70%, capping layer 826 is a InP capping layer, and layer 838 is a InGaAs device layer that is lattice matched to the InP capping layer 826.

Figure 9B:
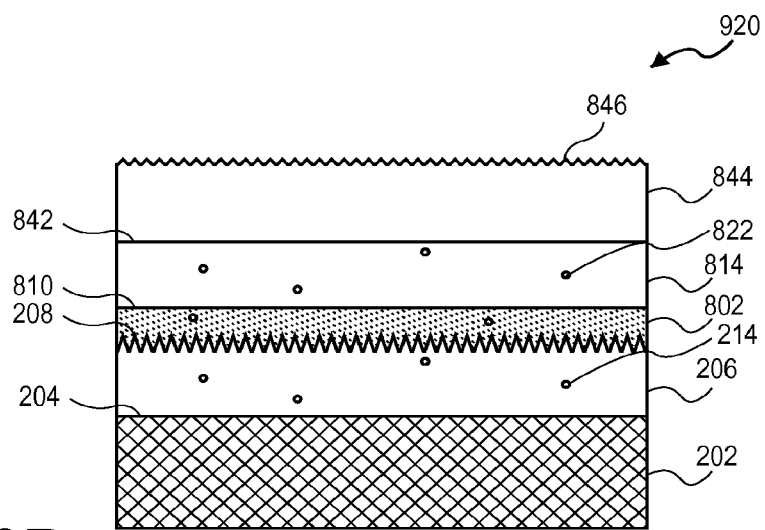

In another embodiment, a method may include first forming a layer 206 having a low defect density on top surface 204 of substrate 202, forming a capping layer 802 having a polished capping surface 810 on layer 206, and forming a second layer 814 above polished capping surface 810 by following steps 102, 104, 106, 702, 704 and 706 in flow chart 700. Steps 302 through 306 in flow chart 300 may then be subsequently followed to achieve a low bulk defect density 822 in second layer 814, to form a polished surface 842 on second layer 814, and to form a third layer 844 above second layer 814. The resultant structure 920 formed using such a described method is shown in FIG. 9B. Structure 920 includes a substrate 202 having a top surface 204 with a lattice constant. A layer 206 is disposed on the top surface 204 of substrate 202 and has a bulk defect density 214 of less than 1E7 defects/cm2. Layer 206 has a top surface 208 with a lattice constant that is different from the lattice constant of the top surface 204 of substrate 202. A capping layer 802 is disposed on the top surface 208 of layer 206. Capping layer 802 has a lattice constant that is approximately equal to the lattice constant of top surface 208 and has a polished capping surface 810 with a root-mean-square surface roughness of less than 1 nm. A second layer 814 is disposed above the polished capping surface 810. Second layer 814 may have a polished surface 842 with a lattice constant. In an embodiment, the lattice constant of polished surface 842 is different from the lattice constant of polished capping surface 810. Second layer 814 has a bulk defect density 822 of less than 1E7 defects/cm2 and polished surface 842 has a RMS surface roughness of less than 1 nm. A third layer 844 having a top surface 846 with a lattice constant is disposed above polished surface 842.

Figure 10:
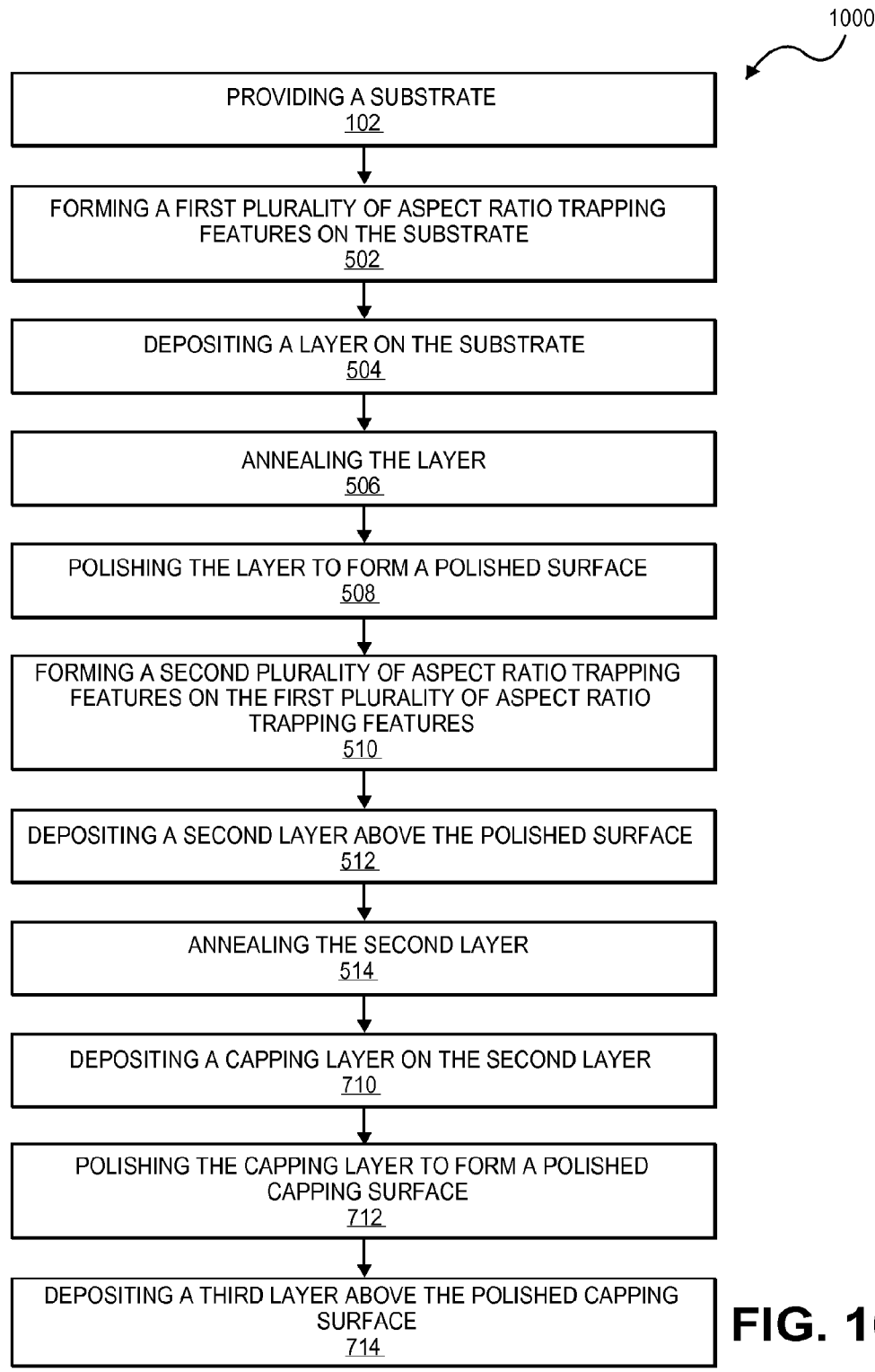
FIG. 10 is a flow chart representing a method of forming hetero-layers with reduced surface roughness and bulk defect density on non-native surfaces, in accordance with an embodiment of the present invention.
Figure 11:
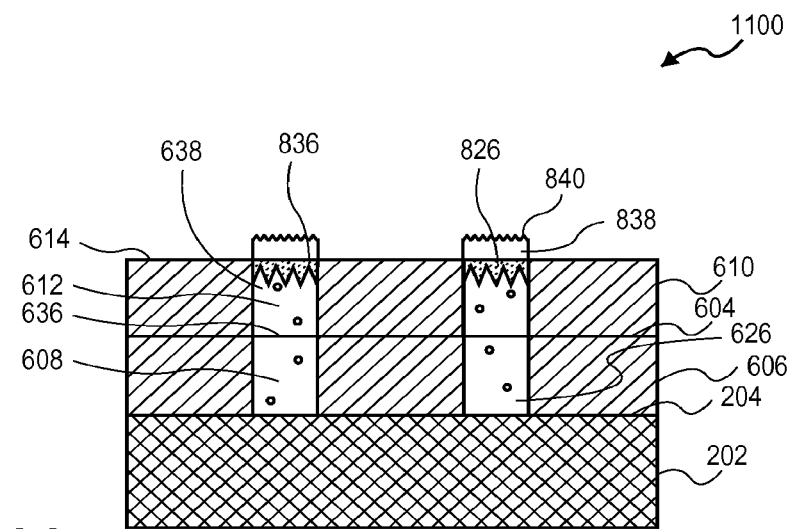
FIG. 11 illustrates a cross-sectional view of a structure formed using a method of forming hetero-layers with reduced surface roughness and bulk defect density on non-native surfaces, in accordance with an embodiment of the present invention.

In yet another embodiment, a method may include forming one or more hetero-layers each having a low bulk defect density and a polished surface, forming one or more hetero-layers each having a low bulk defect density and each having a capping layer with a polished capping surface, and forming ART features. One such embodiment is represented by flow chart 1000 in FIG. 10. The method includes adding steps 710-714 in flow chart 700 after steps 102 and 502-514 in flow chart 500. Structure 1100, as shown in FIG. 11, is formed using the method set forth in flow chart 1000. Structure 1100 includes a substrate 202 having a top surface 204 with a lattice constant. A first plurality of ART features 606 is formed on the top surface 204 of substrate 202 as set forth in step 502 of flow chart 1000. The first plurality of ART features are spaced apart to form a first plurality of ART trenches 608. A layer 626 is deposited on the top surface 204 of substrate 202 and in the first plurality of ART trenches 608 as set forth in step 504 of flow chart 1000. Layer 626 is annealed as set forth in step 506 of flow chart 1000 to reduce the bulk defect density to less than 1E7 defects/cm2. Layer 626 is then polished as set forth in step 508 of flow chart 1000 to create a polished surface 636 having a root-mean-square surface roughness of less than 1 nm. Polished surface 636 has a lattice constant that is different (lattice constant mismatch) from the lattice constant of the top surface 204 of substrate 202. The first plurality of ART features 606 have top surfaces 604 that are approximately planar with polished surface 636 of layer 626. A second plurality of ART features 610 is formed above and aligned with the first plurality of ART features 608 as set forth in step 502 of flow chart 1000. The second plurality of ART features 610 forms a second plurality of ART trenches 612. A second layer 638 is deposited above polished surface 626 and in the second plurality of ART trenches 612 as set forth in step 512 of flow chart 1000. Second layer 638 has a top surface with a lattice constant. In an embodiment, the lattice constant of top surface of the second layer 638 is different from the lattice constant of polished surface 626. Second layer 638 is annealed as set forth in step 514 of flow chart 1000 to reduce the bulk defect density to less than 1E7 defects/cm2. A capping layer 826 is then deposited as set forth in step 710 of flow chart 1000 except that capping layer 826 is deposited on the top surface of second layer 638 in the second plurality of ART trenches 612 instead of on the top surface of second layer 814. Capping layer 826 has a lattice constant that is approximately equal to the lattice constant of top surface of second layer 638. Capping layer 826 is polished to form a polished capping surface 836 with a root-mean-square surface roughness of less than 1 nm as set forth in step 712 of flow chart 1000. In one embodiment, the second plurality of ART features 610 has a top surface 614 that is approximately planar with the polished capping surface 836. A third layer 838 having a top surface 840 with a lattice constant is then deposited above polished capping surface 836 as set forth in step 714 of flow chart 1000. Although not shown in FIG. 11, third layer 814 may be overgrown to form a continuous layer above top surface 614 and polished capping surface 810, in an embodiment. In another embodiment, a third plurality of ART features (not shown) may be formed above the second plurality of ART features and third layer 814 is formed between the third plurality of ART features.

Figure 12:
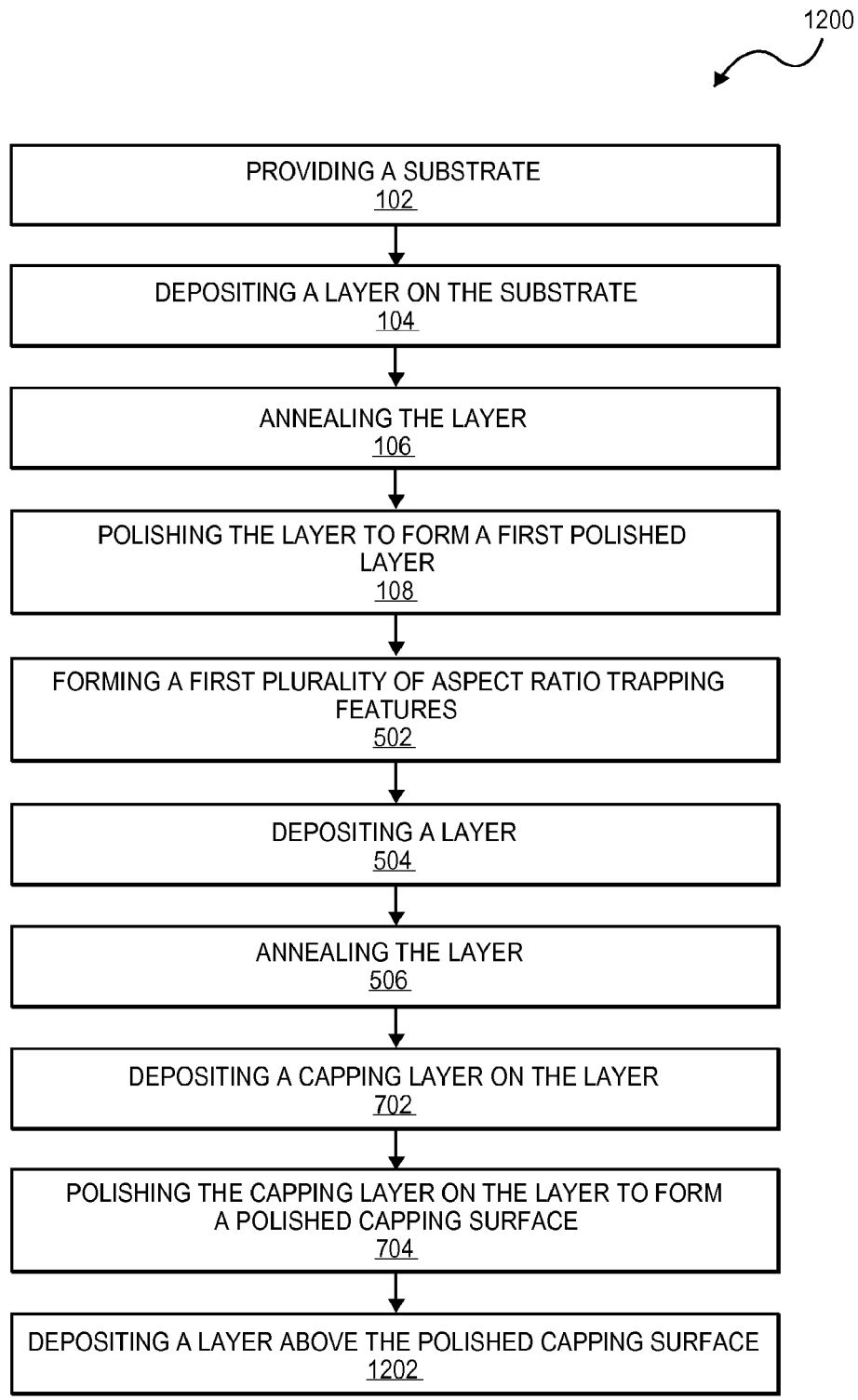
FIG. 12 is a flow chart representing a method of forming hetero-layers with reduced surface roughness and bulk defect density on non-native surfaces, in accordance with an embodiment of the present invention.
Figure 13:
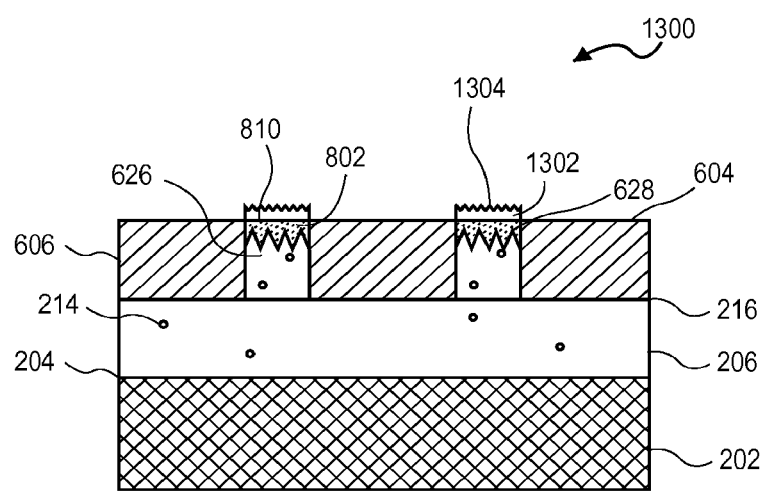
FIG. 13 illustrates a cross-sectional view of a structure formed using a method of forming hetero-layers with reduced surface roughness and bulk defect density on non-native surfaces, in accordance with an embodiment of the present invention.

In yet another embodiment, a method may include forming ART features on the polished surface of a hetero-layer having a low bulk defect density and forming a hetero-layer having a low bulk defect density in the ART trenches between the ART features. The hetero-layer in the ART trenches may be formed having a polished surface. For example, in one such embodiment, the method includes steps 102-108 of flow chart 100 followed by steps 502-506 of flow chart 500 and followed by step 508 of flowchart 500. Alternatively, a capping layer having a polished capping surface may be formed on the hetero-layer in the ART trenches. In one such embodiment, the method includes steps 102-108 of flow chart 100 followed by steps 502-506 of flow chart 500 and then followed by steps 702-706 of flow chart 700 as represented by flow chart 1200 shown in FIG. 12. Structure 1300, as shown in FIG. 13, may be formed using the method set forth in flow chart 1200. Structure 1300 includes a substrate 202 having a top surface 204 with a lattice constant. A layer 206 having a lattice constant that is different from the lattice constant of top surface 204 of substrate 202 is deposited on the top surface of substrate 202 as set forth in step 104 of flow chart 1200. Layer 206 is annealed as set forth in step 106 of flow chart 1200 to reduce the bulk defect density to less than 1E7 defects/cm2. Layer 206 is then polished as set forth in step 108 of flow chart 1200 to form a polished surface 216 having a root-mean square surface roughness of less than 1 nm. Next, ART features 606 are formed as set forth in step 502 of flow chart 1200 except that the ART features 606 are formed on polished surface 216 of layer 206 instead of top surface 204 of substrate 202. The ART features 606 are spaced apart to form ART trenches between the ART features 606. A layer 626 is deposited in the ART trenches as set forth in step 504 of flow chart 1200 except that layer 626 is deposited on polished surface 216 of layer 206 instead of top surface 204 of substrate 202 and the top surface 628 of layer 626 is below rather than above the top surface 604 of the ART features 606. In an embodiment, the lattice constant of the top surface 628 of layer 626 is different (lattice constant mismatch) from the lattice constant of polished surface 216 of layer 206. Layer 626 is annealed as set forth in step 506 of flow chart 1200 to reduce the bulk defect density to less than 1E7 defects/cm2. In an embodiment, a capping layer 802 may be formed as set forth in step 702 of flow chart 1200 except capping layer 802 is deposited on the top surface 628 of layer 626 in the ART trenches instead of on the top surface 208 of layer 206. Capping layer 802 has a lattice constant that is approximately equal to the lattice constant of the top surface 628 of layer 626. Capping layer 802 is polished as set forth in step 704 of flow chart 1200 to create polished capping surface 810 with a root-mean square surface roughness of less than 1 nm. In an embodiment, the top surface 604 of the plurality of ART features 606 is approximately planar with the polished capping surface 810. A layer 1302 having a top surface 1304 with a lattice constant is then deposited above polished capping surface 810 as set forth in step 1202 of flow chart 1200. In an embodiment, third layer 1302 is formed only on capping layer 810. Although not shown in FIG. 13, layer 1302 may be overgrown to form a continuous layer above polished capping surface 810 and the top surface 604 of ART features 606, in an embodiment. In a specific embodiment of the structure illustrated in FIG. 13, substrate 202 is silicon, layer 206 is GaAs, layer 626 is InAlAs, and layer 802 is InP.

In an embodiment where a capping layer is not formed on the top surface 628 of layer 626 (not shown), layer 626 is deposited in step 504 of flow chart 1200 such that the top surface 628 of layer 626 is above the top surface 604 of ART features 606. Layer 626 is then annealed as set forth in step 506 of flow chart 1200 to reduce the bulk defect density to less than 1E7 defects/cm2. Instead of depositing a capping layer as set forth in step 702 of flow chart 1200, layer 626 is polished as set forth in step 508 of flow chart 500 to form a polished surface 636. Layer 1302 may then be deposited above polished surface 636 of layer 626 instead of above polished capping surface 810 as set forth in step 1202 in flow chart 1200. In a specific embodiment, substrate 202 is silicon, layer 206 is GaAs, and layer 626 is InAlAs.

Figure 14:
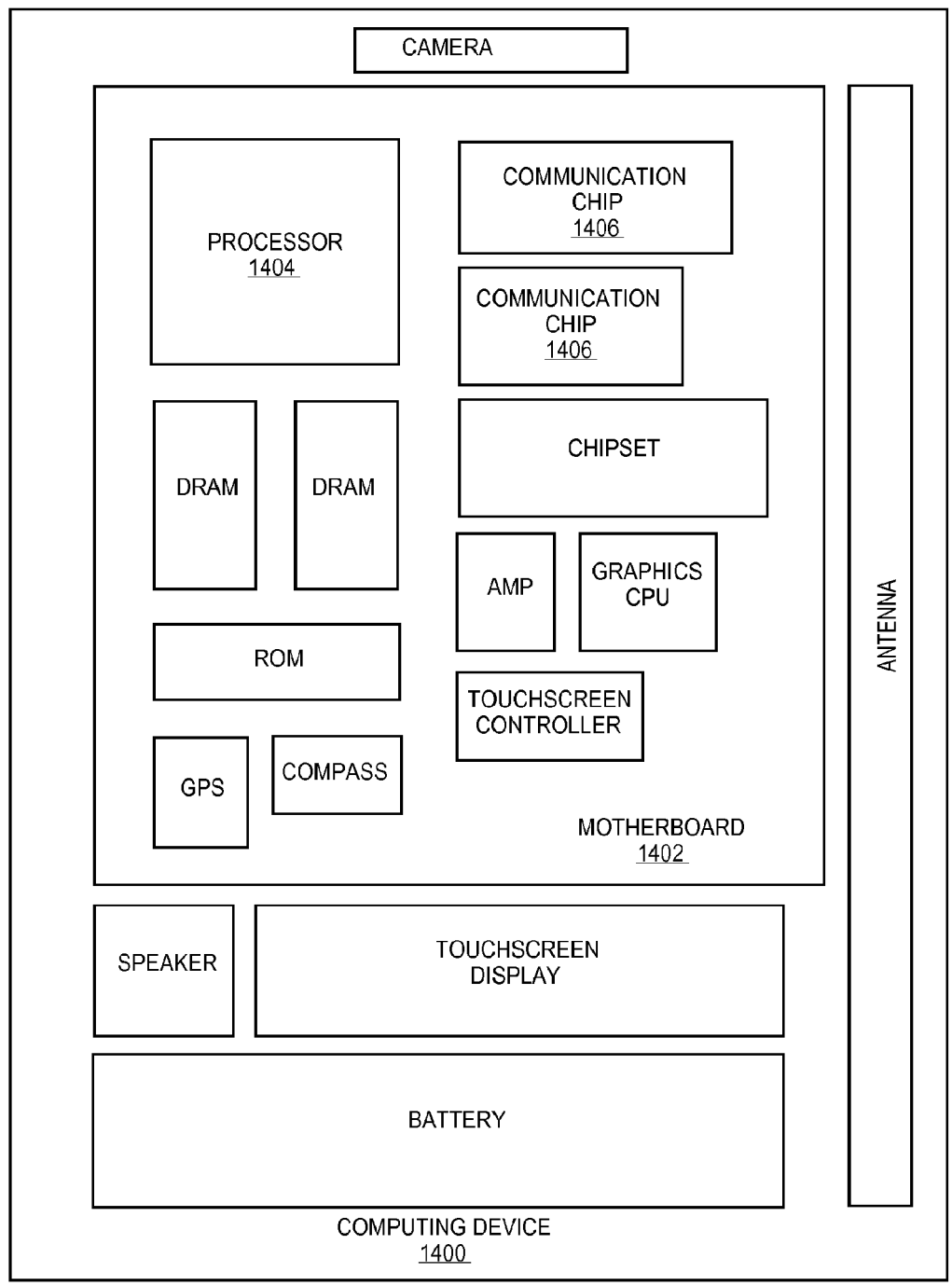
FIG. 14 illustrates a computing device in accordance with one implementation of the invention.

FIG. 14 illustrates a computing device 1400 in accordance with one implementation of the invention. The computing device 1400 houses a board 1402. The board 1402 may include a number of components, including but not limited to a processor 1404 and at least one communication chip 1406. The processor 1404 is physically and electrically coupled to the board 1402. In some implementations the at least one communication chip 1406 is also physically and electrically coupled to the board 1402. In further implementations, the communication chip 1406 is part of the processor 1404.

Depending on its applications, computing device 1400 may include other components that may or may not be physically and electrically coupled to the board 1402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter range wireless communications, such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 includes an integrated circuit die packaged within the processor 1404. In some implementations of the present invention, the integrated circuit die of the processor includes one or more devices, such as transistors form over hetero-layers with reduced surface roughness and bulk defect density on non-native surfaces, that are formed on in accordance with implementations of the invention. The term "processor" may refer to any device or portion of a device that processes electronic data from registers and/or memory to transform that electronic data into other electronic data that may be stored in registers and/or memory.

The communication chip 1406 also includes an integrated circuit die packaged within the communication chip 1406. In accordance with another implementation of the invention, the integrated circuit die of the communication chip includes one or more devices, such as transistors formed over hetero-layers with reduced surface roughness and bulk defect density on non-native surfaces that are formed in accordance with implementations of the invention.

In further implementations, another component housed within the computing device 1200 may contain an integrated circuit die that includes one or more devices, such as transistors formed over hetero-layers with reduced surface roughness and bulk defect density on non-native surfaces, that are formed in accordance with implementations of the invention.

In various implementations, the computing device 1400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

What is claimed is:

1. A method of forming a structure comprising:
   providing a substrate having a top surface with a first lattice constant;
   depositing a first layer on the top surface of the substrate, wherein the first layer has a top surface with a second lattice constant that is different from the first lattice constant;
   annealing the first layer at a first temperature and for a first duration that does not substantially change a stoichiometry of the first layer;
   depositing a first capping layer on the first layer after annealing the first layer, said first capping layer has a uniform lattice constant that is approximately equal to the second lattice constant, and wherein the first capping layer and the first layer are different semiconducting materials;
   polishing the first capping layer to form a first polished capping surface; and
   depositing a second layer above said first polished capping surface, wherein the second layer has a top surface with a third lattice constant.

2. The method of claim 1, wherein the first layer is annealed at a sufficiently high temperature and for a sufficiently long time to achieve a bulk defect density of $<1\times10^7$ defects/cm$^2$ in the first layer and/or a root-mean-square surface roughness on the top surface of first layer that is greater than 20 nm and wherein the first polished surface has a root-mean-square surface roughness of less than 1 nm and a peak-to-valley surface roughness range of less than 10 nm.

3. The method of claim 1, wherein the first lattice constant has a lattice constant mismatch with the second lattice constant of at least about 1%.

4. The method of claim 1, further comprising removing an oxide layer from the first polished capping surface prior to depositing the second layer.

5. The method of claim 1, further comprising depositing an initial layer on the first polished capping surface prior to depositing the second layer, wherein the second layer is deposited on the initial layer, and wherein the initial layer has a lattice constant approximately equal to the second lattice constant.

6. The method of claim 1, further comprising:
annealing the second layer, wherein the third lattice constant is different from the second lattice constant;
polishing the second layer to form a second polished surface with a fourth lattice constant; and
depositing a third layer above said second polished surface, wherein the third layer has a top surface with a fifth lattice constant.

7. The method of claim 1, further comprising:
annealing the second layer, wherein the third lattice constant is different from the second lattice constant;
depositing a second capping layer on the top surface of the second layer, said second capping layer has a lattice constant that is approximately equal to the third lattice constant;
polishing the second capping layer to form a second polished capping surface; and
depositing a third layer above said second polished capping surface, wherein the third layer has a top surface with a fifth lattice constant.

8. The method of claim 1, further comprising:
forming a first plurality of aspect ratio trapping features on the top surface of the substrate, said first plurality of aspect ratio trapping features are spaced apart to form a first plurality of aspect ratio trapping trenches, wherein said first layer is deposited in said first plurality of aspect ratio trapping trenches, and wherein said first plurality of aspect ratio trapping features has a top surface that is approximately planar with said first polished capping surface.

9. The method of claim 8, further comprising:
forming a second plurality of aspect ratio trapping features on the first plurality of aspect ratio trapping features, said second plurality of aspect ratio trapping features are aligned with said first plurality of aspect ratio trapping features and form a second plurality of aspect ratio trapping trenches, wherein said second layer is deposited in said second plurality of aspect ratio trapping trenches.

10. The method of claim 1, further comprising:
forming a first plurality of aspect ratio trapping features on the first polished capping surface, said plurality of aspect ratio trapping features are spaced apart to form a first plurality of aspect ratio trapping trenches, wherein said second layer is deposited in said first plurality of aspect ratio trapping trenches;
annealing the second layer, wherein the third lattice constant is different from the second lattice constant;
depositing a second capping layer on the top surface of the second layer and in the aspect ratio trapping trenches, said second capping layer has a lattice constant that is approximately equal to the third lattice constant;
polishing the second capping layer to form a polished capping surface; and
depositing a third layer above said polished second capping surface, wherein the third layer has a top surface with a fifth lattice constant.

* * * * *